(12) United States Patent
Hirakawa

(10) Patent No.: US 7,377,610 B2
(45) Date of Patent: May 27, 2008

(54) DROPLET DISCHARGE CONTROL METHOD AND LIQUID DISCHARGE APPARATUS

(75) Inventor: Takashi Hirakawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 314 days.

(21) Appl. No.: 11/092,807

(22) Filed: Mar. 30, 2005

(65) Prior Publication Data
US 2005/0219296 A1 Oct. 6, 2005

(30) Foreign Application Priority Data
Mar. 31, 2004 (JP) ............... 2004-107675

(51) Int. Cl.
B41J 2/205 (2006.01)
(52) U.S. Cl. .......................... 347/15; 347/43
(58) Field of Classification Search ................. 347/15, 347/43
See application file for complete search history.

(56) References Cited

U.S. PATENT DOCUMENTS 6,257,685 B1 * 7/2001 Ishikawa ................. 347/10
6,450,604 B1 * 9/2002 Iwaishi et al. ............. 347/10

FOREIGN PATENT DOCUMENTS

| JP | 59232877 A | * 12/1984 |
| JP | 5-278221 A | 10/1993 |
| JP | 9-272226 A | 10/1997 |

* cited by examiner

Primary Examiner—Thinh Nguyen
(74) Attorney, Agent, or Firm—Birch, Stewart, Kolasch & Birch, LLP

(57) ABSTRACT

The method of controlling droplet discharge for a liquid discharge apparatus which discharges droplets from a discharge head onto a discharge receiving medium, the method comprises the steps of: discharging at least three droplets substantially simultaneously on a same line so that at least mutually adjacent droplets overlap when landing on the discharge receiving medium; controlling the droplet discharge so that a droplet discharge amount sequentially increases in a relative manner from a center area toward both ends of a dot group formed by the at least three droplets; and forming the dot group which contains the at least three dots with substantially a same diameter on the same line.

22 Claims, 18 Drawing Sheets

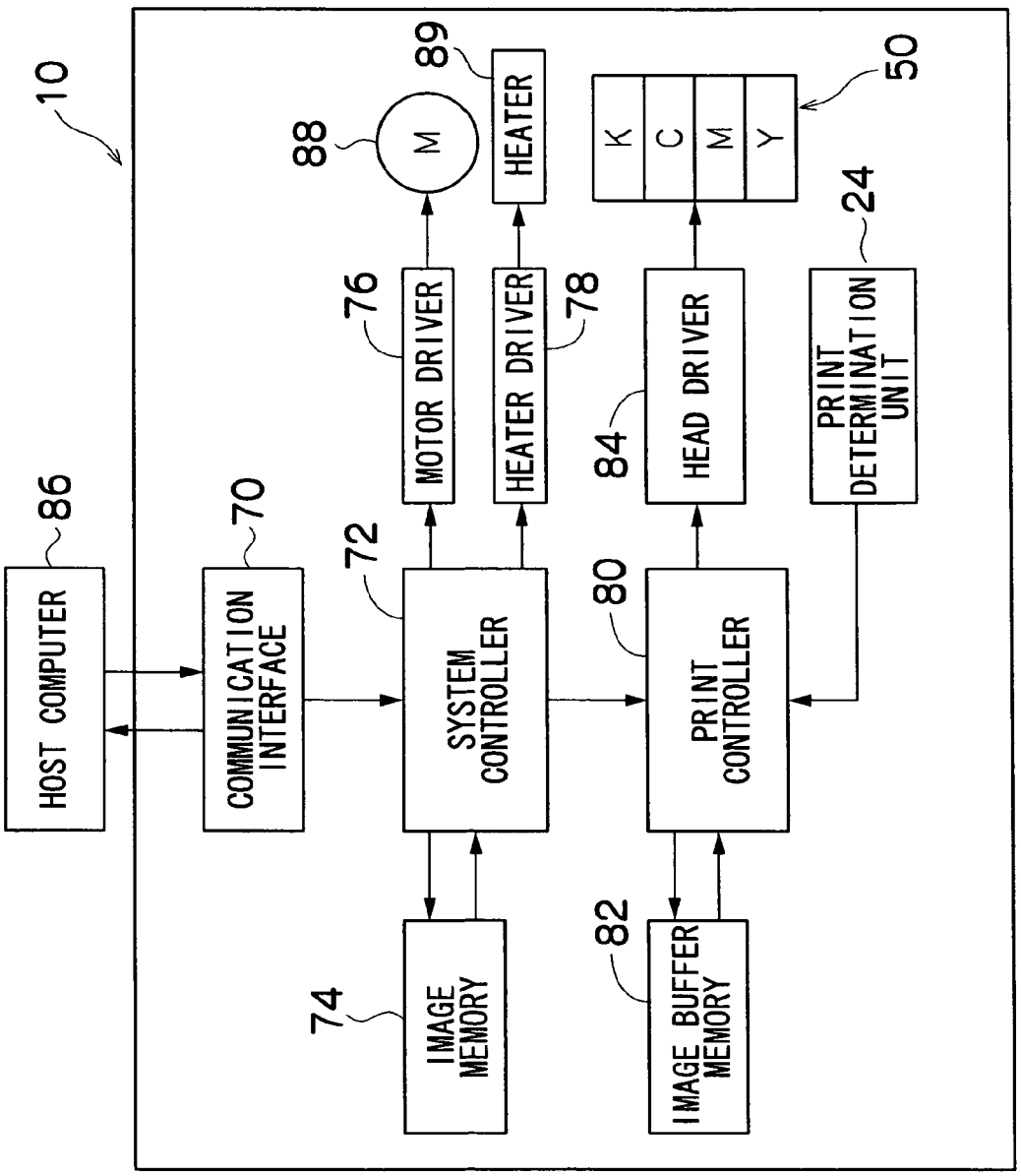

DROPLET DISCHARGE CONTROL METHOD AND LIQUID DISCHARGE APPARATUS

BACKGROUND OF THE INVENTION

1. Field of the Invention

The present invention relates to a droplet discharge control method, and a liquid discharge apparatus, and more particularly to a droplet discharge control technique which forms a favorable image, drawing, or another shape with consideration for the effect of mutual interference of the droplets as they land.

2. Description of the Related Art

In recent years, inkjet printers have come to be used widely as data output apparatuses for outputting images, documents, or the like. An inkjet printer forms data on recording paper by driving recording elements (nozzles) of a recording head in accordance with data, thereby causing ink to be ejected from the nozzles.

In an inkjet printer, a recording medium and a recording head with a large number of nozzles are moved in a relative fashion, and a desired image is formed on the recording medium by ejecting ink droplets from the nozzles.

There is a demand for high-speed and high-quality printing in inkjet recording apparatuses, and high-speed printing is achieved by reducing the ink droplet discharge cycle, conveying the recording medium at a large velocity, and performing other techniques.

In order to print high-quality images, on the other hand, high-quality half-toning and higher resolution is achieved by making the dots that form the image more minute and ensuring higher density. Making the dots smaller is achieved by discharging ink in small amounts, for example, and increasing the density of the dots by forming with greater density the nozzles which eject ink. When the dots are made more highly dense, the spacing between dots that are formed in mutually adjacent positions results in an overlapping formation area thereof.

In a row of dots formed so that a plurality of ink droplets land substantially simultaneously and mutually overlap, a phenomenon (landing interference) occurs in which the ink droplets that have landed on the surface of the recording medium join with each other and are drawn to the vicinity of the center area, and dots with a prescribed size are not formed.

Therefore, in order to inhibit such landing interference, droplet discharge control is carried out so as to impart a time difference to the dots which are formed by droplet discharge, wait for the previously landed ink droplet to permeate the recording medium, and then discharge the ink droplet that will land subsequently.

However, when droplets are simultaneously discharged to a line in the main scanning direction with a line-type head to form a single line in the main scanning direction, it is difficult to impart a time difference to the droplet discharges that form adjacent dots.

The related art is more specifically described below with reference to FIGS. 12A to 14D.

FIGS. 12A and 12B are diagrams that describe the discharge control in the inkjet recording apparatus according to the related art.

FIG. 12A shows a row 200 of dots formed on the same line in main scanning direction, sub-scanning direction, or another direction using an inkjet recording apparatus. In the row 200 of dots, dots 202, 204, and 206 with the same diameter D are aligned with the same pitch P between the dots. The droplets land so that the droplets discharged to mutually adjacent droplet discharge points on the recording paper overlap (that is to say, so as to satisfy the relation D>P).

FIG. 12B shows the shape of the ink droplet 210 after landing when ink droplets which form the dots in the row 200 of dots shown in FIG. 12A are discharged simultaneously (with the same timing). The ink droplets that form the dots of the row 200 of dots come together when the ink in the center area is drawn by mutual interference (landing interference) at the time of landing. This is a phenomenon that occurs due to the fact that the ink droplets (liquid droplets) have a characteristic whereby they take a round spherical shape due to the effect of the surface tension of the ink.

Therefore, the density of the ink increases in the vicinity of the center area, the width of the center area increases in comparison with both ends, and when the combined ink droplet 210 is fixed on the recording paper, the width h in the center area is h=D' (where D'>D), and the line width at both ends is h=D" (where D"<D), forming a nonuniform line drawing (row 200 of dots). As used herein, the term "width at both ends" refers to the width of the dots formed by the ink discharged to the landing points at both ends.

In the present specification, the term "dot" refers to a substantially circular point formed when an ink droplet discharged onto the recording paper is fixed on the recording paper. When the shape of the ink droplet breaks down and a shape that is different from a substantially circular shape is formed, or when a shape is formed that differs from a shape formed by the overlapping of a plurality of substantially circular shapes due to phenomena such as the grouping of a plurality of ink droplets, the shape formed by the discharge point is also referred to as a dot.

The aspect in which droplets are discharged with the same timing may include an aspect in which droplets are discharged at short time intervals, and an example of short time intervals is time in which the permeation time of the ink is 1% or less.

A more specific example is shown in FIGS. 13A to 13D and FIGS. 14A to 14D. It should be noted that in FIGS. 13A to 13D and FIGS. 14A to 14D, the same key symbols are assigned to the same or similar portions as in FIGS. 12A and 12B, and a description thereof is omitted.

FIG. 13A shows a dot 202 with a diameter D=30 μm formed by an ink droplet discharge amount of 2 pL, and FIGS. 13B to 13D show line drawings (rows of dots) 212 to 216 that are formed when three or more ink droplets are discharged on the same line with the following discharge conditions: an ink amount of 2 pL per single discharge, a dot diameter D=30 μm when the dots are formed singly by the ink droplets, a pitch of P=10 μm between the dots, and simultaneous droplet discharge (delay time of the droplet discharges is 1% of the ink droplet permeation time or less).

FIG. 13B shows a line drawing 212 formed when five ink droplets are simultaneously discharged under the above-described conditions, the ink at both ends is drawn to the ink in the center area, the width hc in the center area is 40 μm, which is wider than the prescribed width of 30 μm, and the width he at both ends is 20 μm, which is less than the prescribed width. Also, the density in the center area is higher than the prescribed density, and the density at both ends is less than the prescribed density.

FIG. 13C shows a line drawing 214 formed when ten ink droplets are simultaneously discharged under the above-described conditions, and FIG. 13D shows a line drawing 216 formed when 60 ink droplets are simultaneously discharged under the above-described conditions.

In the line drawing 214 formed with 10 ink droplets, the width hc in the center area side is 45 µm, which is greater than the prescribed width, the width he at both ends is 20 µm, which is less than the prescribed width, and since the width of the line drawing 214 sequentially changes from the center area toward both ends, the slope (percentage that the width changes) is substantially fixed, as shown in FIG. 13C.

In the line drawing 216 formed with 60 ink droplets, the width hc in the center area side is 50 µm, which is greater than the prescribed width D, and the width he at both ends is 15 µm, which is less than the prescribed width, as shown in FIG. 13D.

FIGS. 14A to 14D show the three-dimensional shape (cross-sectional shape) of the ink that forms the dot 202 and line drawings 212, 214, and 216 shown in FIGS. 13A to 13D.

FIGS. 14B to 14D show the cross-sectional shapes of the line drawings 212, 214, and 216 which are all half oval shapes with the center portion serving as the apex such that the height decreases from the center area to both ends.

In this manner, when three or more dots with the same size are formed on the same line by simultaneously discharged droplets so that the droplets overlap on the recording paper at the time of landing, the droplet amount in the center area becomes greater than the droplet amount at both ends, the width of the center area increases in comparison with the width at both ends, the density increases, a nonuniform line drawing is formed, and the image quality is reduced.

It should be noted that the numerical values shown in FIGS. 13A to 13D are merely examples, and the indicated values may vary depending on the type of ink, type of recording paper (recording medium), and combinations thereof.

The recording method and apparatus cited in Japanese Patent Application Publication No. 9-272226 are configured so that the original recording data and interpolation data are output during separate head scans and recording is performed in order to prevent mutual interference of adjacent dots, and ink bleeding and mixing between the inks are prevented.

However, the discharge timing can be controlled so as to wait for the ink droplet that previously landed to permeate (to become fixed to) the medium and to then discharge the ink droplet that will land next in order to solve the problems of the related art shown in FIG. 12A to FIG. 14D, but the discharge cycle cannot be reduced with control in which the subsequent ink lands after the previously landed ink droplet completes permeation. Also, since the permeation time of the ink (permeation velocity) varies depending on the combination of ink and recording medium, control must be carried out so as to vary the discharge cycle in accordance with the type of ink and recording medium that is to be used, and the control load of the apparatus is increased.

In the recording method and apparatus thereof cited in Japanese Patent Application Publication No. 9-272226, the original recording data scan and the interpolation data scan must be separately carried out when dots are formed with high density, a reduction in productivity is unavoidable, and it is difficult to achieve both higher image quality and higher printing speed.

SUMMARY OF THE INVENTION

The present invention has been contrived in view of such circumstances, and an object thereof is to provide a droplet discharge control method and droplet discharge apparatus wherein higher image quality and higher printing speed are ensured by controlling the droplet discharge with consideration for the landing interference of the droplets.

In order to attain the aforementioned object, the present invention is directed to a method of controlling droplet discharge for a liquid discharge apparatus which discharges droplets from a discharge head onto a discharge receiving medium, the method comprising the steps of: discharging at least three droplets substantially simultaneously on a same line so that at least mutually adjacent droplets overlap when landing on the discharge receiving medium; controlling the droplet discharge so that a droplet discharge amount sequentially increases in a relative manner from a center area toward both ends of a dot group formed by the at least three droplets; and forming the dot group which contains the at least three dots with substantially a same diameter on the same line.

According to the present invention, since the droplet discharge amount is controlled so as to sequentially increase in a relative manner from the center area toward both ends of a dot group formed by three or more droplets when forming three or more dots with the same diameter on the same line, favorable dots with a uniform size can be formed across the entire area of the dot group without the formation of nonuniform dots caused by the grouping of droplets in the center area due to mutual interference when the droplets land. Also, the density in the dot group is uniform.

In a dot group formed from four dots, for example, the second and third dots constitute the center area and the dot size of the first and fourth dots may be greater than the size of the second and third dots. The term "discharge head" includes a full-line head having discharge nozzles that discharge droplets aligned across a length corresponding to the entire width of the recording medium; a serial discharge head (shuttle-scan discharge head) that discharges droplets onto the discharge receiving medium while a short head in which discharge holes which discharge droplets across a length that is shorter than the length corresponding to the entire width of the discharge receiving medium is scanned in the width direction of the discharge receiving medium; and other types of heads.

A full-line discharge head may be one in which short heads having short rows of discharge holes that do not have a length corresponding to the entire width of the discharge receiving medium are arrayed and joined in a staggered formation in a length that corresponds to the entire width of the discharge receiving medium.

The discharge receiving medium includes continuous paper, cut paper, seal paper, and other types of paper; OHP sheets and other resin sheets; as well as film, cloth, metal, and various other media without regard to materials. The term "discharge receiving medium" includes media that are referred to as a target recording medium, recording medium, recording medium, liquid-receiving medium, image formation medium, and the like.

As used herein, the term "dot" refers to shapes that are different from the intended substantially circular shape formed at the discharge points (dot formation points in the image data); and shapes that correspond to the inherently configured dots that are formed at the droplet discharge points, as a type of shape formed when a plurality of droplets are integrated together.

A substantially simultaneous discharge of droplets includes cases in which droplets are discharged in short time intervals such as when the permeation time of the droplet is 1%, and cases in which a single line is formed by a full-line head in the width direction (main scanning direction) of the discharge receiving medium, for example.

In an aspect in which the droplet discharge amount of the droplets is gradually increased in a sequential manner, the droplet discharge amount may be increased in a continuous manner, or the droplet discharge amount may be increased in a stepwise fashion every several droplets. In the present droplet discharge control, at least two types of droplet discharge amounts may be provided.

The direction of a line may be the main scanning direction or the sub-scanning direction, for example, and may also be a diagonal direction having a component in the main scanning direction and a component in the sub-scanning direction. The line is not limited to a straight line, and may be a curve, or a combination of a curve and a straight line.

In order to attain the aforementioned object, the present invention is also directed to a liquid discharge apparatus, comprising: a discharge head which discharges droplets onto a discharge receiving medium; and a control device which, when the discharge head discharges at least three droplets substantially simultaneously on a same line so that at least mutually adjacent droplets overlap when landing on the discharge receiving medium, controls droplet discharge so that a droplet discharge amount sequentially increases in a relative manner from a center area toward both ends of a dot group formed by the at least three droplets, and forms the dot group which contains the at least three dots with substantially a same diameter on the same line.

According to the present invention, it is preferable that a droplet discharge amount modification device for modifying the droplet discharge amount of the droplets is provided, and the control device controls the droplet discharge amount modification device to control the droplet discharge amount of the droplets.

Also possible is a configuration provided with a recording device in which the droplet discharge amounts in the droplet discharges during formation of three or more dots on the same line by substantially simultaneous droplet discharges are converted into a data table and recorded, and the droplet discharge amount of each droplet discharge is read from the data table when carrying out simultaneous droplet discharges. It should be noted that the recording device may be housed inside the apparatus, or may be detachably mounted on the apparatus.

Preferably, when at least one parameter selected from a droplet overlap amount on the discharge receiving medium and a surface tension between droplets on the discharge receiving medium increases, the control device increases a percentage by which the droplet discharge amount increases in accordance with the at least one parameter.

In other words, since droplets that gather in the center area increase as the magnitude of the surface tension with which two droplets that are in mutual contact pull on each other increases, the dot diameter of the dots formed after becoming fixed can be reliably made uniform by increasing the percentage by which the droplet discharge amount increases in accordance with the surface tension.

When the amount (contact surface area) of overlap between two droplets that are in contact with each other increases, control can be carried out so that the percentage by which the droplet discharge amount is increased is made greater, because the surface tension operating between the droplets increases.

Preferably, the control device carries out control that switches between at least two types of droplet discharge amounts.

In other words, when the configuration is designed to switch between two types of the droplet discharge amounts selected from among the droplet discharge amount of the center area and the droplet discharge amount of both ends, the switching control of the droplet discharge amount can be simplified.

Preferably, the control device makes the droplet discharge amount in the center area of the row of dots less than an original droplet discharge amount.

In other words, since the amount of liquid in the center increases due to mutual interference at the time of landing, the droplet discharge amount in the center area is reduced in advance in anticipation of this situation, dots with the originally intended size can be formed across the entire row of dots, and a row of dots with a uniform density can be formed with the originally intended density.

In accordance with the present invention, when droplets are discharged with substantially the same timing so that the droplets overlap with each other at the time of landing when forming three or more dots having the same diameter on the same line, control is carried out so that the droplet discharge amount increases from the center area toward both ends. Therefore, nonuniformity in the density and in the dot diameter after fixing can be resolved even if the droplets at both ends are drawn to the liquid in the center, and the amount of liquid in the center area increases.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 7 is a principal block diagram showing the system composition of the inkjet recording apparatus;

DETAILED DESCRIPTION OF THE PREFERRED EMBODIMENTS

General Configuration of an Inkjet Recording Apparatus

Figure 1:
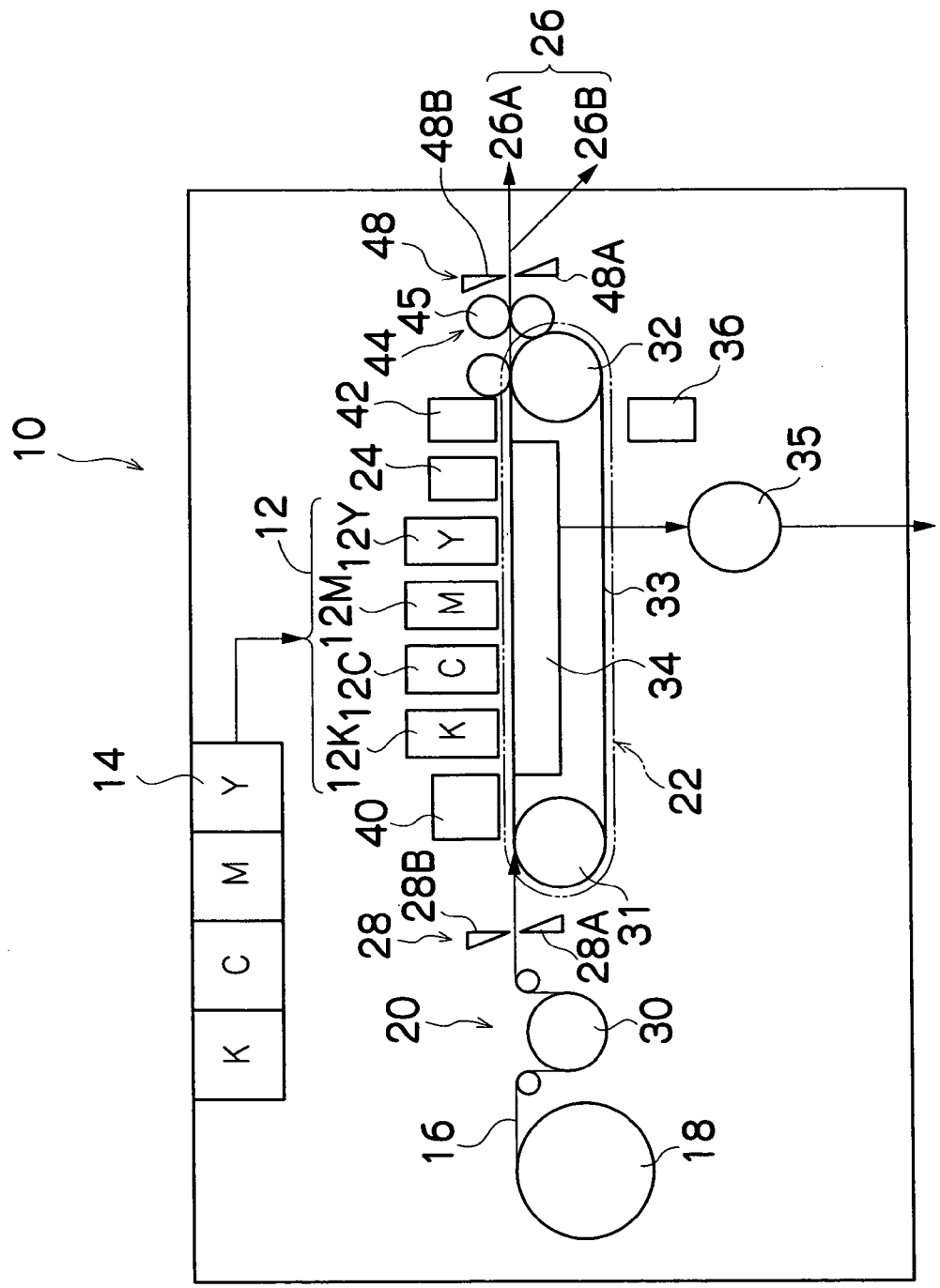
FIG. 1 is a general schematic drawing of an inkjet recording apparatus according to an embodiment of the present invention.

FIG. 1 is a general schematic drawing of an inkjet recording apparatus according to an embodiment of the present invention. As shown in FIG. 1, the inkjet recording apparatus 10 comprises: a printing unit 12 having a plurality of print heads 12K, 12C, 12M, and 12Y for ink colors of black (K), cyan (C), magenta (M), and yellow (Y), respectively; an ink storing and loading unit 14 for storing inks of K, C, M and Y to be supplied to the print heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink-droplet discharge face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

In FIG. 1, a single magazine for rolled paper (continuous paper) is shown as an example of the paper supply unit 18; however, a plurality of magazines with paper differences such as paper width and quality may be jointly provided. Moreover, paper may be supplied with a cassette that contains cut paper loaded in layers and that is used jointly or in lieu of a magazine for rolled paper.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite from the curl direction in the magazine. The heating temperature at this time is preferably controlled so that the recording paper 16 has a curl in which the surface on which the print is to be made is slightly round outward.

In the case of the configuration in which roll paper is used, a cutter (first cutter) 28 is provided as shown in FIG. 1, and the continuous paper is cut into a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyor pathway. When cut paper is used, the cutter 28 is not required.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a horizontal plane (flat plane).

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1; and the suction chamber 34 provides suction with a fan 35 to generate a negative pressure, and the recording paper 16 is held on the belt 33 by suction.

The belt 33 is driven in the clockwise direction in FIG. 1 by the motive force of a motor (not shown in FIG. 1, but shown as a motor 88 in FIG. 7) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, examples thereof include a configuration in which the belt 33 is nipped with a cleaning roller such as a brush roller and a water absorbent roller, an air blow configuration in which clean air is blown onto the belt 33, or a combination of these. In the case of the configuration in which the belt 33 is nipped with the cleaning roller, it is preferable to make the line velocity of the cleaning roller different than that of the belt 33 to improve the cleaning effect.

The inkjet recording apparatus 10 can comprise a roller nip conveyance mechanism, in which the recording paper 16 is pinched and conveyed with nip rollers, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

Figure 2:
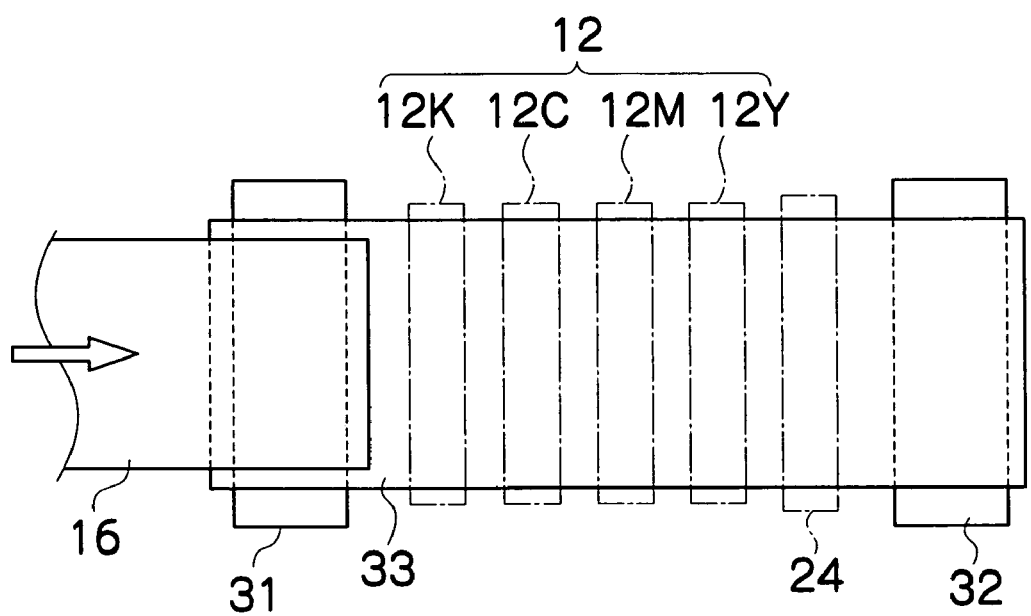
FIG. 2 is a plan view of principal components of an area around a printing unit of the inkjet recording apparatus in FIG. 1.

As shown in FIG. 2, the printing unit 12 forms a so-called full-line head in which a line head having a length that corresponds to the maximum paper width is disposed in the main scanning direction perpendicular to the delivering direction of the recording paper 16 (hereinafter referred to as the paper conveyance direction) represented by the arrow in FIG. 2, which is substantially perpendicular to a width direction of the recording paper 16. A specific structural example is described later with reference to FIGS. 3A to 5. Each of the print heads 12K, 12C, 12M, and 12Y is composed of a line head, in which a plurality of ink-droplet ejection apertures (nozzles) are arranged along a length that exceeds at least one side of the maximum-size recording paper 16 intended for use in the inkjet recording apparatus 10, as shown in FIG. 2.

The print heads 12K, 12C, 12M, and 12Y are arranged in this order from the upstream side along the paper conveyance direction. A color print can be formed on the recording paper 16 by ejecting the inks from the print heads 12K, 12C, 12M, and 12Y, respectively, onto the recording paper 16 while conveying the recording paper 16.

The print unit 12, in which the full-line heads covering the entire width of the paper are thus provided for the respective ink colors, can record an image over the entire surface of the recording paper 16 by performing the action of moving the recording paper 16 and the print unit 12 relatively to each other in the sub-scanning direction just once (i.e., with a single sub-scan). Higher-speed printing is thereby made possible and productivity can be improved in comparison with a shuttle type head configuration in which a print head reciprocates in the main scanning direction.

Although the configuration with the KCMY four standard colors is described in the present embodiment, combinations of the ink colors and the number of colors are not limited to those, and light and/or dark inks can be added as required. For example, a configuration is possible in which print heads for ejecting light-colored inks such as light cyan and light magenta are added.

As shown in FIG. 1, the ink storing and loading unit 14 has tanks for storing the inks of K, C, M and Y to be supplied to the print heads 12K, 12C, 12M, and 12Y, and the tanks are connected to the print heads 12K, 12C, 12M, and 12Y through channels (not shown), respectively. The ink storing and loading unit 14 has a warning device (e.g., a display device, an alarm sound generator) for warning when the remaining amount of any ink is low, and has a mechanism for preventing loading errors among the colors.

The print determination unit 24 has an image sensor for capturing an image of the ink-droplet deposition result of the print unit 12, and functions as a device to check for ejection defects such as clogs of the nozzles in the print unit 12 from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the print heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 24 reads a test pattern printed with the print heads 12K, 12C, 12M, and 12Y for the respective colors, and the ejection of each head is determined. The ejection determination includes the presence of the ejection, measurement of the dot size, and measurement of the dot deposition position. The details of the ejection determination are described later.

The post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

The heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathway in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown in FIG. 1, the paper output unit 26A for the target prints is provided with a sorter for collecting prints according to print orders.

Next, the structure of the print heads is described. The print heads 12K, 12C, 12M and 12Y have the same structure, and a reference numeral 50 is hereinafter designated to any of the print heads 12K, 12C, 12M and 12Y.

Figure 3A:
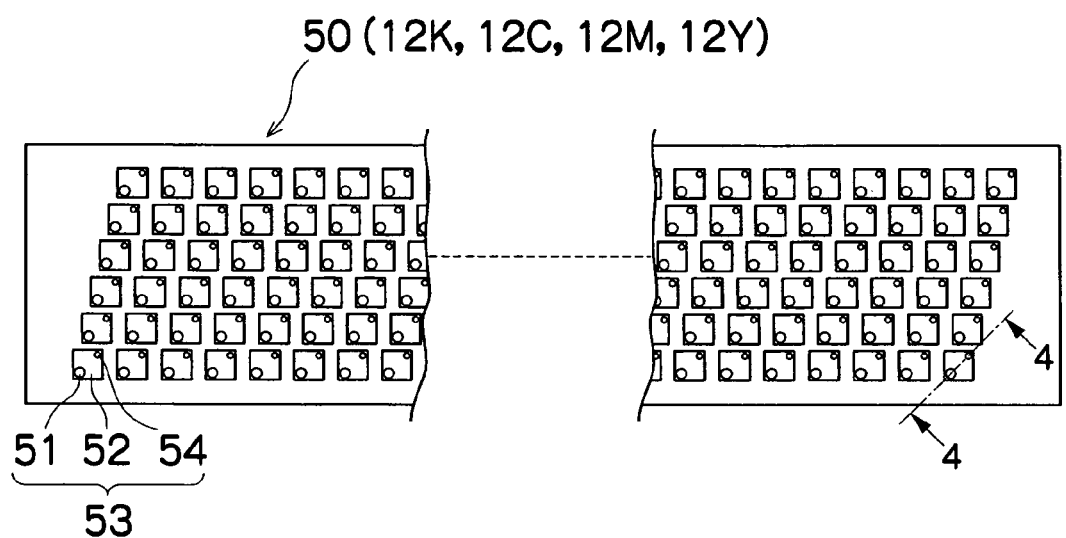
FIG. 3A is a perspective plan view showing an example of a configuration of a print head.
Figure 3B:
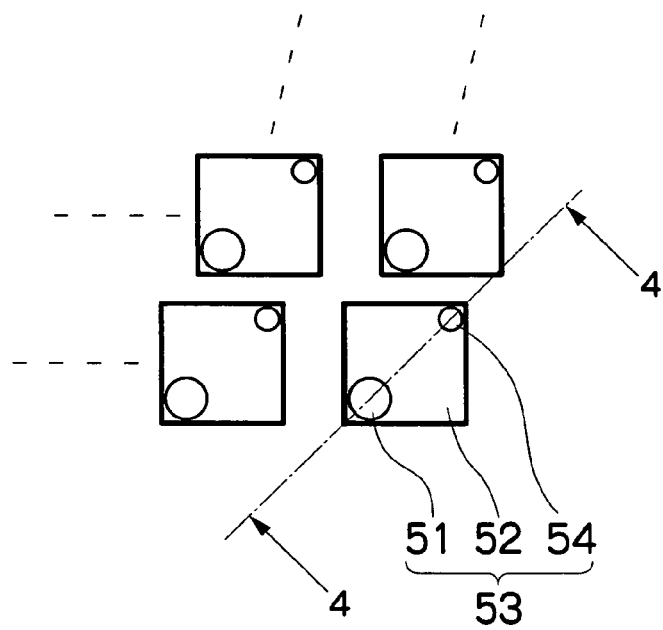
FIG. 3B is a partial enlarged view of FIG. 3A.
Figure 3C:
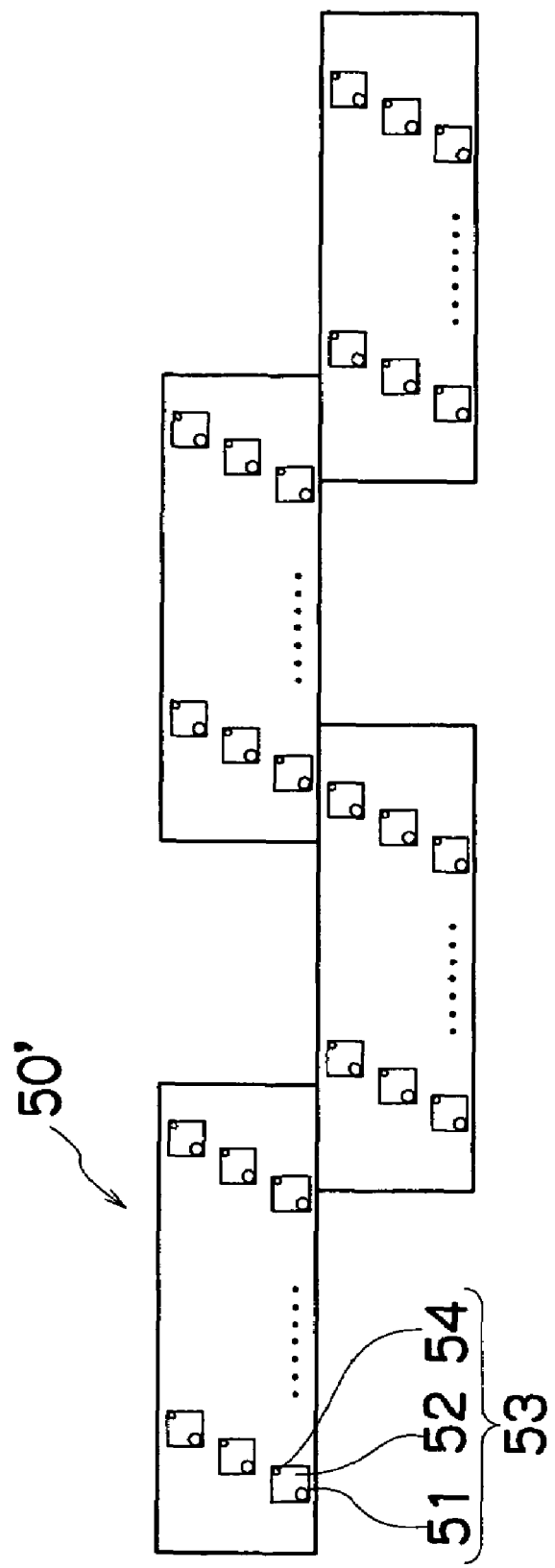
FIG. 3C is a perspective plan view showing another example of the configuration of the print head.
Figure 4:
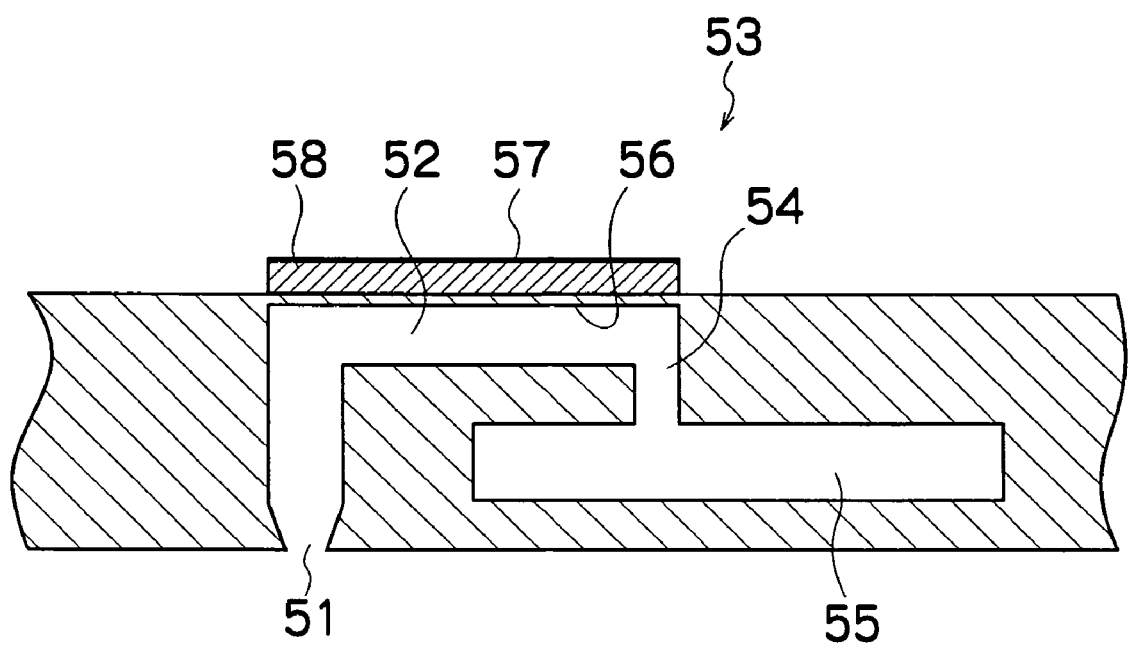
FIG. 4 is a cross-sectional view along a line 4-4 in FIGS. 3A and 3B.

FIG. 3A is a perspective plan view showing an example of the configuration of the print head 50, FIG. 3B is an enlarged view of a portion thereof, FIG. 3C is a perspective plan view showing another example of the configuration of the print head, and FIG. 4 is a cross-sectional view taken along the line 4-4 in FIGS. 3A and 3B, showing the inner structure of an ink chamber unit. The nozzle pitch in the print head 50 should be minimized in order to maximize the density of the dots printed on the surface of the recording paper. As shown in FIGS. 3A, 3B, 3C and 4, the print head 50 in the present embodiment has a structure in which a plurality of ink chamber units 53 including nozzles 51 for ejecting ink-droplets and pressure chambers 52 connecting to the nozzles 51 are disposed in the form of a staggered matrix, and the effective nozzle pitch is thereby made small.

Thus, as shown in FIGS. 3A and 3B, the print head 50 in the present embodiment is a full-line head in which one or more of nozzle rows in which the ink discharging nozzles 51 are arranged along a length corresponding to the entire width of the recording medium in the direction substantially perpendicular to the conveyance direction of the recording medium.

Alternatively, as shown in FIG. 3C, a full-line head can be composed of a plurality of short two-dimensionally arrayed head units 50' arranged in the form of a staggered matrix and combined so as to form nozzle rows having lengths that correspond to the entire width of the recording paper 16.

As shown in FIGS. 3A to 3C, the planar shape of the pressure chamber 52 provided for each nozzle 51 is substantially a square, and the nozzle 51 and an inlet of supplied ink (supply port) 54 are disposed in both corners on a diagonal line of the square. As shown in FIG. 4, each pressure chamber 52 is connected to a common channel 55 through the supply port 54.

An actuator 58 having a discrete electrode 57 is joined to a pressure plate 56, which forms the ceiling of the pressure chamber 52, and the actuator 58 is deformed by applying drive voltage to the discrete electrode 57 to eject ink from the nozzle 51. When ink is ejected, new ink is delivered from the common channel 55 through the supply port 54 to the pressure chamber 52.

Figure 5:
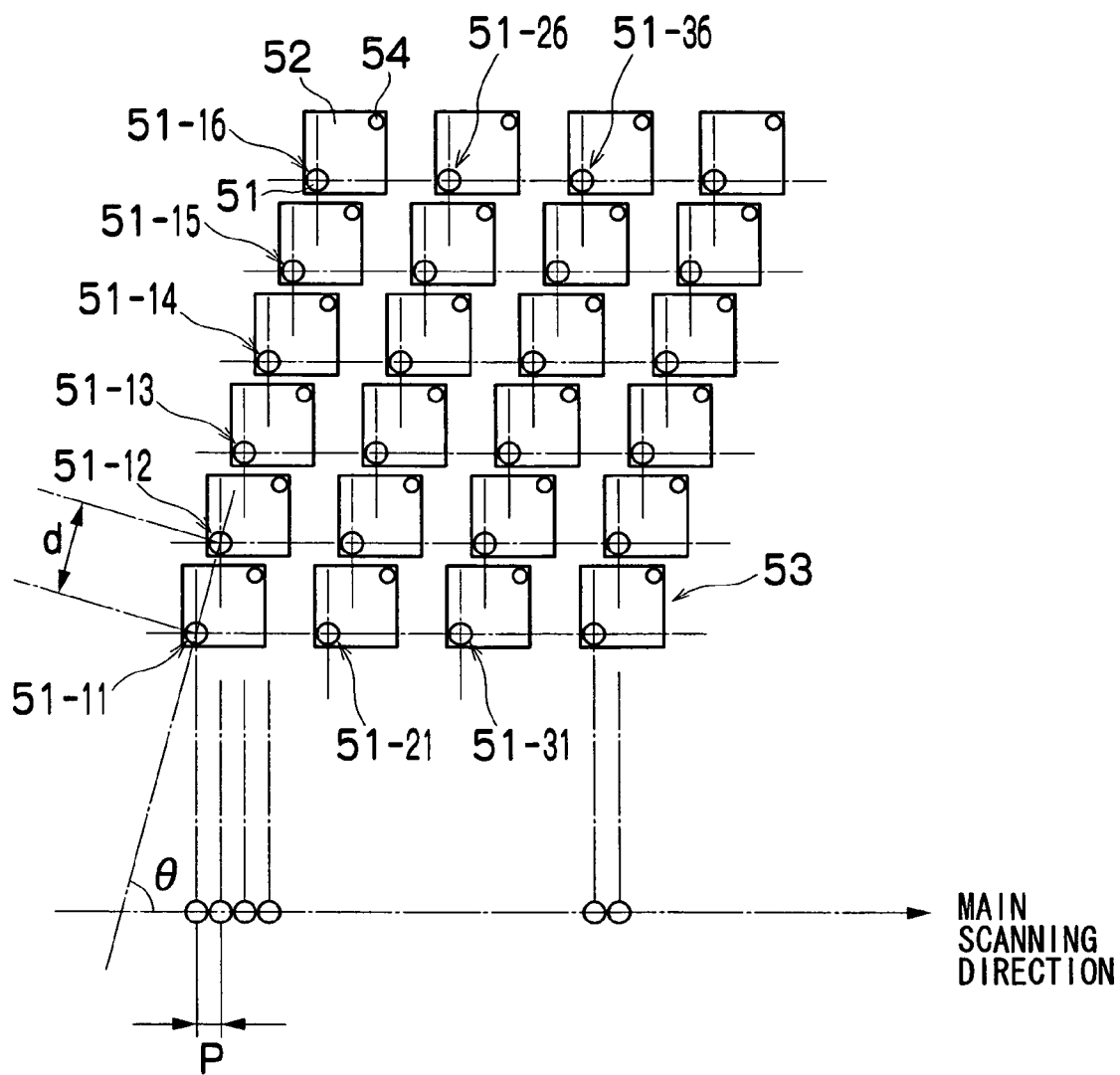
FIG. 5 is an enlarged view showing nozzle arrangement of the print head in FIG. 3A.

The plurality of ink chamber units 53 having such a structure are arranged in a grid with a fixed pattern in the line-printing direction along the main scanning direction and in the diagonal-row direction forming a fixed angle $\theta$ that is not a right angle with the main scanning direction, as shown in FIG. 5. With the structure in which the plurality of rows of ink chamber units 53 are arranged at a fixed pitch d in the direction at the angle $\theta$ with respect to the main scanning direction, the nozzle pitch P as projected in the main scanning direction is $d \times \cos \theta$.

Hence, the nozzles 51 can be regarded to be equivalent to those arranged at a fixed pitch P on a straight line along the main scanning direction. Such configuration results in a nozzle structure in which the nozzle row projected in the main scanning direction has a high nozzle density of up to 2,400 nozzles per inch (npi). Described below for convenience of description is a print head in which the nozzles 51 are arrayed in a linear fashion at fixed intervals (pitch P) in the lengthwise direction (main scanning direction) of the head.

In a full-line head comprising rows of nozzles that have a length corresponding to the entire width of the paper (the recording paper 16), the "main scanning" is defined as to print one line (a line formed of a row of dots, or a line formed of a plurality of rows of dots) in the width direction of the recording paper (the direction perpendicular to the delivering direction of the recording paper) by driving the nozzles in one of the following ways: (1) simultaneously driving all the nozzles; (2) sequentially driving the nozzles from one side toward the other; and (3) dividing the nozzles into blocks and sequentially driving the blocks of the nozzles from one side toward the other.

In particular, when the nozzles 51 arranged in a matrix such as that shown in FIG. 5 are driven, the main scanning according to the above-described (3) is preferred. More specifically, the nozzles 51-11, 51-12, 51-13, 51-14, 51-15 and 51-16 are treated as a block (additionally; the nozzles 51-21, 51-22, . . . , 51-26 are treated as another block; the nozzles 51-31, 51-32, . . . , 51-36 are treated as another block, . . . ); and one line is printed in the width direction of the recording paper 16 by sequentially driving the nozzles 51-11, 51-12, . . . , 51-16 in accordance with the conveyance velocity of the recording paper 16.

On the other hand, the "sub-scanning" is defined as to repeatedly perform printing of one line (a line formed of a row of dots, or a line formed of a plurality of rows of dots) formed by the main scanning, while moving the full-line head and the recording paper relatively to each other.

In the present embodiment, a full-line print head is exemplified, but the scope present invention is not limited thereto, and application may also be made to a shuttle print head that forms a single line in the main scanning direction as the print head scans in the main scanning direction.

In implementing the present invention, the arrangement of the nozzles is not limited to that of the example illustrated. Application may also be made to a print head with a nozzle row in the main scanning direction.

Moreover, a method is employed in the present embodiment where an ink droplet is ejected by means of the deformation of the actuator 58, which is typically a piezoelectric element; however, in implementing the present invention, the method used for discharging ink is not limited in particular, and instead of the piezo jet method, it is also possible to apply various types of methods, such as a thermal jet method where the ink is heated and bubbles are caused to form therein by means of a heat generating body such as a heater, ink droplets being ejected by means of the pressure of these bubbles.

Figure 6:
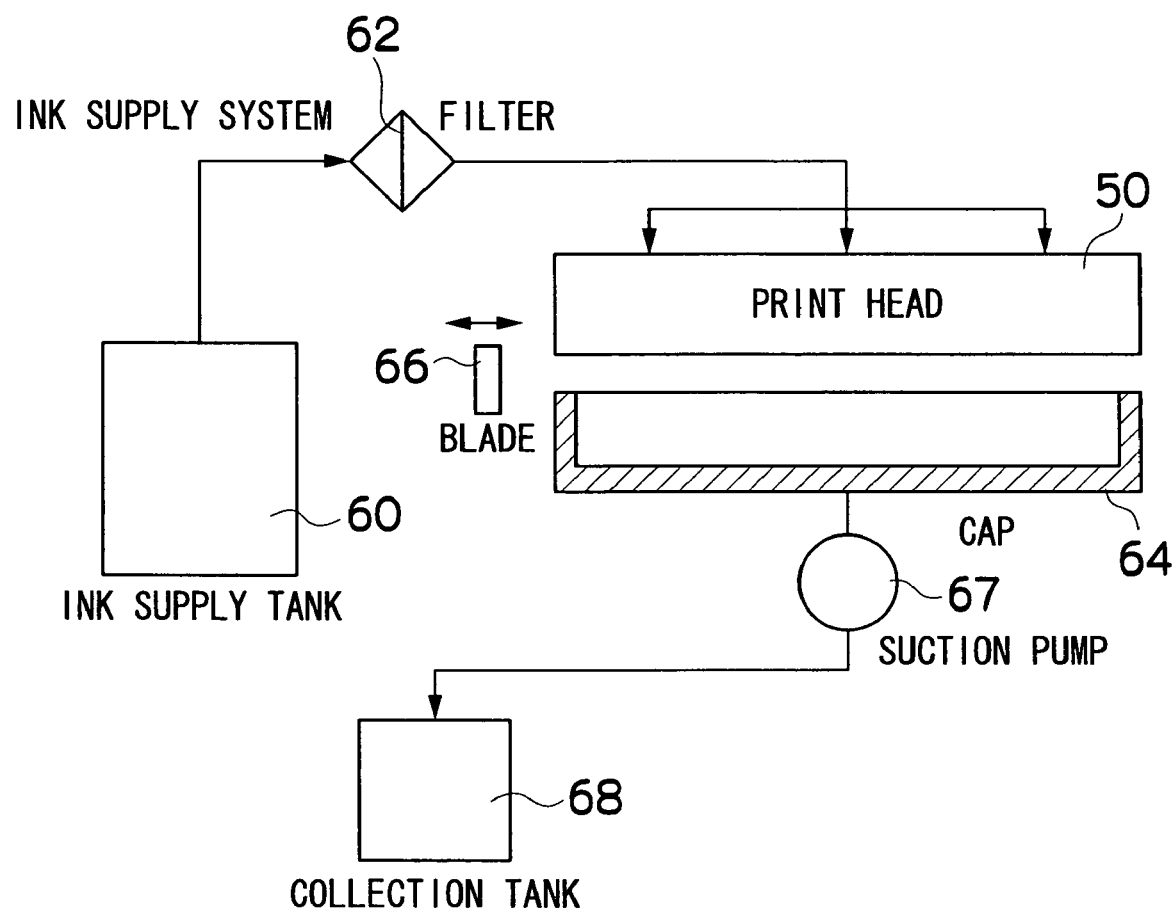
FIG. 6 is a schematic drawing showing a configuration of an ink supply system in the inkjet recording apparatus.

FIG. 6 is a schematic drawing showing the configuration of the ink supply system in the inkjet recording apparatus 10.

An ink supply tank 60 is a base tank that supplies ink and is set in the ink storing and loading unit 14 described with reference to FIG. 1. The aspects of the ink supply tank 60 include a refillable type and a cartridge type: when the remaining amount of ink is low, the ink supply tank 60 of the refillable type is filled with ink through a filling port (not shown) and the ink supply tank 60 of the cartridge type is replaced with a new one. In order to change the ink type in accordance with the intended application, the cartridge type is suitable, and it is preferable to represent the ink type information with a bar code or the like on the cartridge, and to perform ejection control in accordance with the ink type. The ink supply tank 60 in FIG. 6 is equivalent to the ink storing and loading unit 14 in FIG. 1 described above.

A filter 62 for removing foreign matters and bubbles is disposed between the ink supply tank 60 and the print head 50 as shown in FIG. 6. The filter mesh size in the filter 62 is preferably equivalent to or less than the diameter of the nozzle and commonly about 20 μm.

Although not shown in FIG. 6, it is preferable to provide a sub-tank integrally to the print head 50 or nearby the print head 50. The sub-tank has a damper function for preventing variation in the internal pressure of the head and a function for improving refilling of the print head.

The inkjet recording apparatus 10 is also provided with a cap 64 as a device to prevent the nozzles 51 from drying out or to prevent an increase in the ink viscosity in the vicinity of the nozzles 51, and a cleaning blade 66 as a device to clean the nozzle face.

A maintenance unit including the cap 64 and the cleaning blade 66 can be moved in a relative fashion with respect to the print head 50 by a movement mechanism (not shown), and is moved from a predetermined holding position to a maintenance position below the print head 50 as required.

The cap 64 is displaced up and down in a relative fashion with respect to the print head 50 by an elevator mechanism (not shown). When the power of the inkjet recording apparatus 10 is switched OFF or when in a print standby state, the cap 64 is raised to a predetermined elevated position so as to come into close contact with the print head 50, and the nozzle face is thereby covered with the cap 64.

During printing or standby, when the frequency of use of specific nozzles 51 is reduced and ink is not discharged for a certain period of time or longer, the ink solvent in the vicinity of the nozzles evaporates, and the ink viscosity increases. In such conditions, ink can no longer be discharged from the nozzles 51 even if the actuator 58 operates.

Before such a state is reached, the actuator 58 is operated (in a viscosity range that allows discharge by the operation of the actuator 58) and the preliminary discharge (purge, dry discharge, liquid discharge, dummy discharge) is made toward the cap 64 (ink receptor) that is designed to eliminate the degraded ink (ink with an elevated viscosity in the vicinity of the nozzle).

Also, when bubbles have become intermixed in the ink inside the print head 50 (inside the pressure chamber 52), ink can no longer be discharged from the nozzles even if the actuator 58 operates. In such a situation, the cap 64 is placed on the print head 50, ink (ink in which bubbles have become intermixed) inside the pressure chamber 52 is removed by suction with a suction pump 67, and the suctioned-off ink is sent to a collection tank 68.

This suction action entails the suctioning of degraded ink whose viscosity has increased (the ink has hardened) when initially loaded into the head, or when service has started after a long period of being stopped. However, since this suction action is performed with respect to all the ink in the pressure chamber 52, the amount of ink consumption is considerable. Therefore, a preferred aspect is one in which a preliminary discharge is performed when the increase in the viscosity of the ink is low.

The cleaning blade 66 is composed of rubber or another elastic member, and can slide on the ink discharge surface (surface of the nozzle plate) of the print head 50 by means of a blade movement mechanism (wiper), which is not shown. When ink droplets or foreign matter has adhered to the nozzle plate, the surface of the nozzle plate is wiped, and the surface of the nozzle plate is cleaned by sliding the cleaning blade 66 on the nozzle plate. However, when unwanted material on ink discharge surface is cleaned by a blade mechanism, a preliminary discharge is carried out in order to prevent the foreign matter from becoming mixed inside the nozzles 51 by the blade.

FIG. 7 is a block diagram of the principal components showing the system configuration of the inkjet recording apparatus 10. The inkjet recording apparatus 10 has a communication interface 70, a system controller 72, an image memory 74, a motor driver 76, a heater driver 78, a print controller 80, an image buffer memory 82, a head driver 84, and other components.

The communication interface 70 is an interface unit for receiving image data sent from a host computer 86. A serial interface such as USB, IEEE1394, Ethernet, wireless network, or a parallel interface such as a Centronics interface may be used as the communication interface 70. A buffer memory (not shown) may be mounted in this portion in order to increase the communication speed. The image data sent from the host computer 86 is received by the inkjet recording apparatus 10 through the communication interface 70, and is temporarily stored in the image memory 74. The image memory 74 is a storage device for temporarily storing images inputted through the communication interface 70, and data is written and read to and from the image memory 74 through the system controller 72. The image memory 74 is not limited to memory composed of a semiconductor element, and a hard disk drive or another magnetic medium may be used.

The system controller 72 controls the communication interface 70, image memory 74, motor driver 76, heater driver 78, and other components. The system controller 72 has a central processing unit (CPU), peripheral circuits therefor, and the like. The system controller 72 controls communication between itself and the host computer 86, controls reading and writing from and to the image memory 74, and performs other functions, and also generates control signals for controlling a heater 89 and the motor 88 in the conveyance system.

The motor driver (drive circuit) 76 drives the motor 88 in accordance with commands from the system controller 72. The heater driver (drive circuit) 78 drives the heater 89 of the post-drying unit 42 or the like in accordance with commands from the system controller 72.

The print controller 80 has a signal processing function for performing various tasks, compensations, and other types of processing for generating print control signals from the image data stored in the image memory 74 in accordance with commands from the system controller 72 so as to apply the generated print control signals (image formation data) to the head driver 84. The print control unit 80 is a control unit having a signal processing function for performing various treatment processes, corrections, and the like, in accordance with the control implemented by the system controller 72, in order to generate a signal for controlling printing, from the image data in the image memory 74, and it supplies the print control signal (image data) thus generated to the head driver 84. Prescribed signal processing is carried out in the print control unit 80, and the discharge amount and the discharge timing of the ink droplets from the respective print heads 50 are controlled via the head driver 84, on the basis of the image data. By this means, prescribed dot size and dot positions can be achieved. It should be noted that the droplet discharge amount, droplet discharge timing, and other printing parameters may be converted to a data table and prerecorded. The recording device in which the data table is recorded may be a memory 74, or may be another recording device. An EEPROM or the like that can rewrite recorded data in a simple manner may be used as the recording device which records the data table.

The print controller 80 is provided with the image buffer memory 82; and image data, parameters, and other data are temporarily stored in the image buffer memory 82 when image data is processed in the print controller 80. The aspect shown in FIG. 7 is one in which the image buffer memory 82 accompanies the print controller 80; however, the image memory 74 may also serve as the image buffer memory 82. Also possible is an aspect in which the print controller 80 and the system controller 72 are integrated to form a single processor.

The head driver 84 drives the actuators 58 for the print heads 12K, 12C, 12M and 12Y of the respective colors on the basis of the print data received from the print controller 80. A feedback control system for keeping the drive conditions for the print heads constant may be included in the head driver 84.

Control programs are stored in the program storage unit (not shown), and a control program is read and executed in accordance with a command of the system controller 72. The program storage unit may use ROM, EEPROM, or another semiconductor memory, or a magnetic disk may be used. An external interface may be provided, and a memory card or a PC card may be used. A plurality of these recording media may naturally be used.

It should be noted that the program storage unit may double as a recording device (not shown) for operation parameters or the like.

The print determination unit 24 is a block that includes a line sensor, as described in FIG. 1. The unit reads the image printed on the recording paper 16, carries out required signal processing to detect the printing state (presence of discharge, variability is droplet discharge, and other factors), and presents the detection results thereof to the print controller 80.

The print controller 80 makes various corrections to the print head 50 on the basis of the information obtained from the print determination unit 24 as required.

It should be noted that the example shown in FIG. 1 has a configuration in which the print determination unit 24 is provided to the print surface side, the print surface is illuminated by a cold-cathode tube or another light source (not shown) disposed nearby the line sensor, and the reflected light thereof is read by the line sensor, but other configurations may used in the implementation of the present invention.

Droplet Discharge Control

Next, the droplet discharge control of the inkjet recording apparatus 10 of a first embodiment of the present invention is described. As shown in the related art, when the same amount of droplets (for example, the amount of ink that can form a dot with a diameter D) is discharged substantially at the same time so as to overlap on the recording paper 16 at discharge points on the same line, a line drawing (key symbol 210, and other key symbols) is formed with an nonuniform width such as those shown in FIGS. 12A and 12B and FIGS. 13A to 13D. In the present inkjet recording apparatus 10, droplet discharge is controlled as described below in order to solve this problem.

Figure 8A:
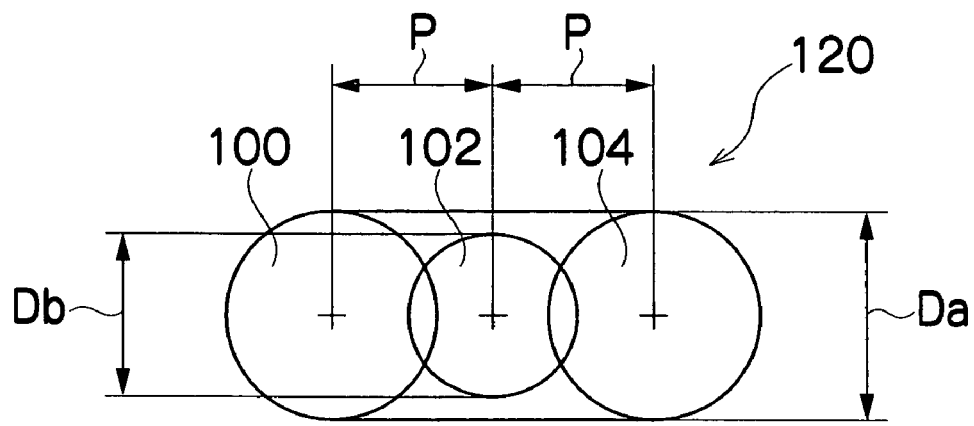
FIGS. 8A and 8B are diagrams describing the discharge control of the first embodiment of the present invention.
Figure 8B:
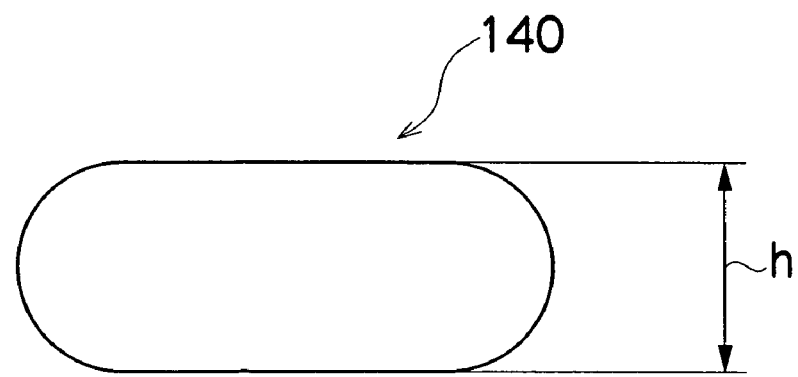

FIG. 8A shows a row 120 of dots in which the dots 100, 102, and 104 are aligned at equal intervals at a pitch P between the dots that form a line drawing (indicated by key symbol 140 in FIG. 8B) with a width h, and FIG. 8B shows a line drawing 140 formed by simultaneously discharging droplets to form the dots 100, 102, and 104 shown in FIG. 8A.

The amount of liquid in the ink droplets that form the dots 100 and 104 is the same, and dots with a diameter Da (D>Da) are formed by the ink droplets. Conversely, the amount of liquid in the ink droplet that forms dot 102 is less than the amount of ink in the ink droplets that form the dots 100 and 104, and a dot with a diameter Db (where D<Db) is formed by the ink droplet.

Here, the diameters D, Da, and Db of the dots 100, 102, and 104 refer to the dot diameters ultimately formed on the recording paper 16 when droplets are discharged as independent droplets. In this case, the relationship between the diameter D of the dots and the width h of the line drawing is D=h.

In other words, droplet discharge is controlled so that the droplet discharge amount (liquid droplet discharge amount) increases in a sequential fashion from the center area to both ends of the line drawing 140. The droplet discharge amount is controlled so that the droplet discharge amount V' (droplet discharge amount of the dots 100 and 104 of FIG. 8A) at both ends is greater than the prescribed amount V (in this case, the droplet discharge amount that can form a dot with a diameter D), and the droplet discharge amount V" (droplet discharge amount of the dot 102 of FIG. 8A) in the center area is less than the prescribed amount V.

The percentage by which the droplet discharge amount is modified can be varied depending on the pitch between the dots and the droplet discharge amount (in particular, the remaining amount of non-permeated liquid that has not permeated the recording paper).

It should be noted that the line drawing 140 may be formed in the main scanning direction or in the sub-scanning direction. The formation direction may also be the diagonal direction having a component in the main scanning direction and the sub-scanning direction. The droplet discharge points may be located on a curved line or on a line having a combination of lines and curves.

Exemplified below are further specific aspects with reference to FIGS. 9A and 9B, and FIGS. 10A to 10C.

Figure 9A:
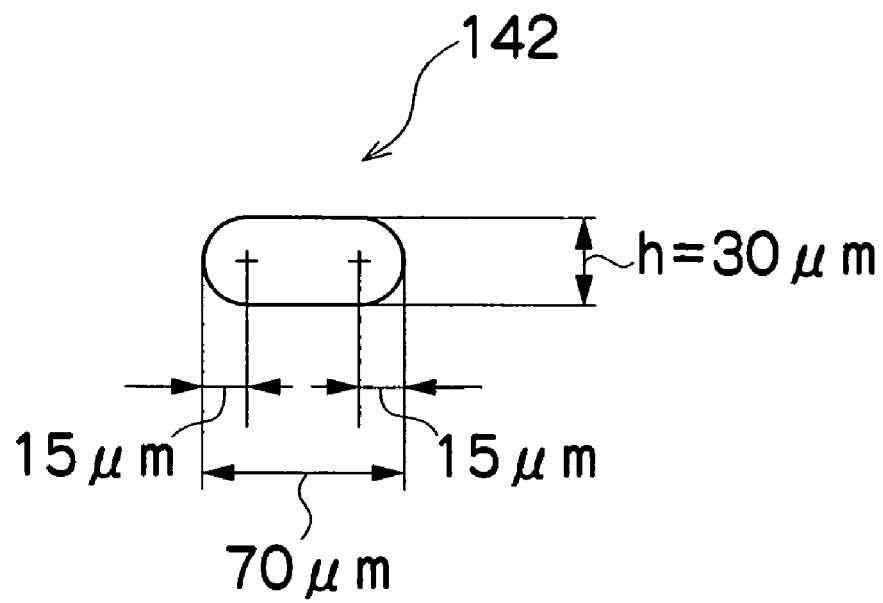
FIGS. 9A and 9B are diagrams showing a line drawing formed with the application of the droplet discharge control shown in FIGS. 8A and 8B.
Figure 9B:
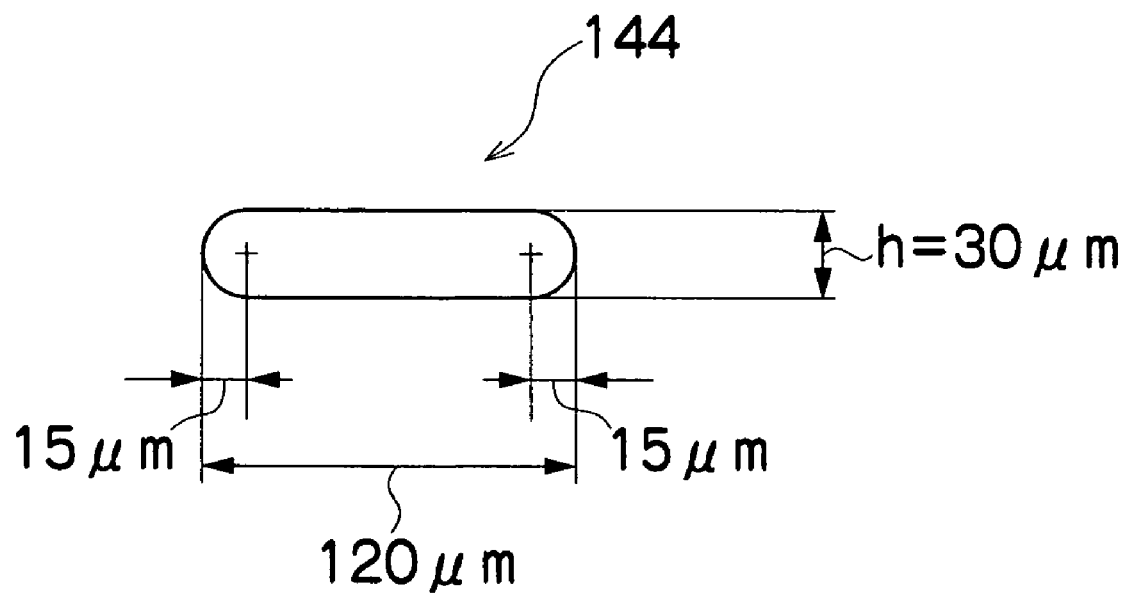

FIG. 9A shows a line drawing 142 with a width of 30 μm and a length of 70 μm formed with the simultaneous discharge of five ink droplets, and FIG. 9B shows a line drawing 144 with a width of 30 μm and a length of 120 μm formed with the simultaneous discharge of 10 ink droplets. It should be noted that the length of the line drawings may be shorter than the length described above. Also, the numerical values are merely examples and do not indicate the applicable scope the present invention.

Figure 10A:
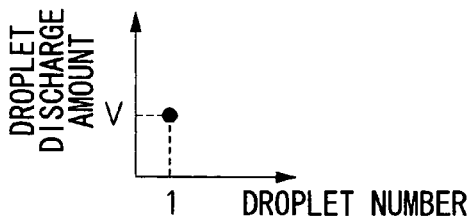
FIGS. 10A to 10D are diagrams describing control of the droplet discharge amount of the forms of droplet discharge control shown in FIGS. 8A and 8B.
Figure 10B:
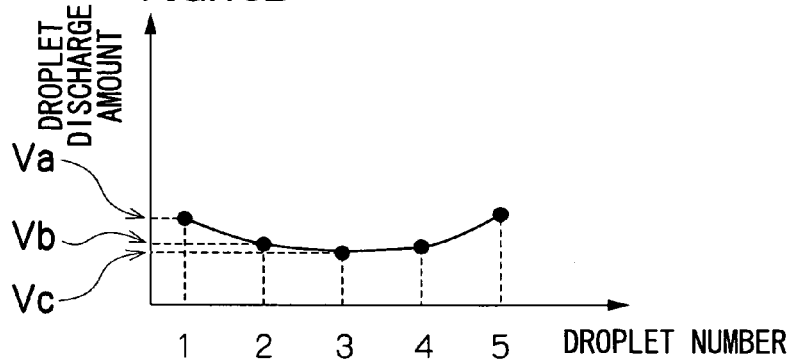
Figure 10C:
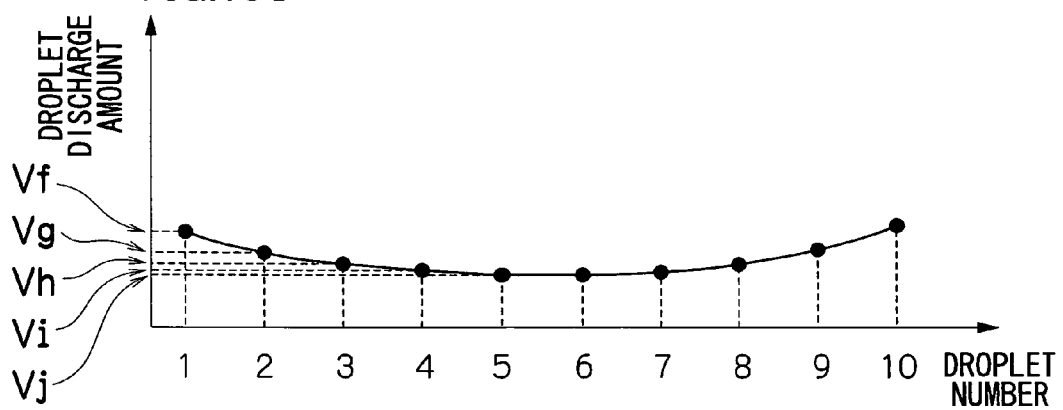
Figure 10D:
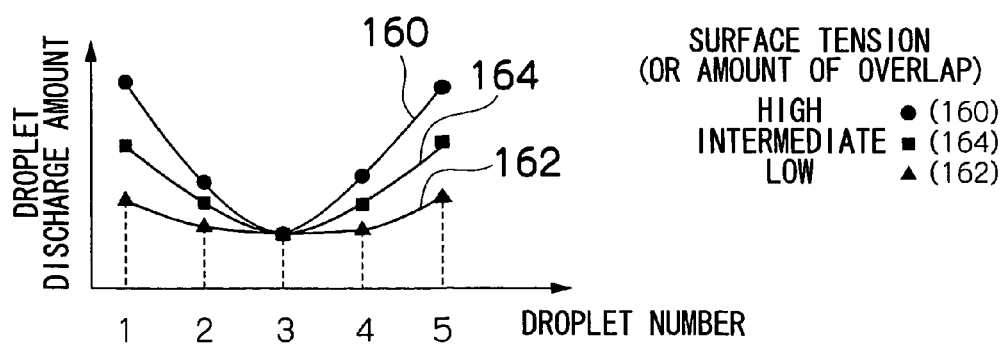

FIG. 10A shows the droplet discharge amount V (same amount as the prescribed amount shown in FIGS. 8A and 8B) that can form a dot with a diameter of 30 μm, FIG. 10B shows the droplet discharge amount of the droplet discharges in the case of five droplets, and FIG. 10C shows the droplet discharge amount of the droplets in the case of ten droplets. FIG. 10D shows the relationship between the droplet discharge amount, and the surface tension between the ink droplets or the overlap amount between the ink droplets. It should be noted that in FIGS. 10A to 10D, the vertical axis represents the droplet discharge amount in the droplet discharges, and the horizontal axis represents the droplet number (droplet discharge point) of the droplet discharges.

When the line drawing 142 is formed from five droplets shown in FIG. 9A, the following relationship (1) satisfies the relationship between the droplet discharge amount Va of the first and fifth droplet discharges, the droplet discharge amount Vb of the second and fourth droplet discharges, and the droplet discharge amount Vc of the third droplet, as shown in FIG. 10B:

$$Va > Vb > Vc. \tag{1}$$

The total amount of the droplets is 2 pL×(number of droplets)=10 pL, and this satisfies the relationship of the following equation (2):

$$2 \times Va + 2 \times Vb + Vc = 10 \text{ pL}. \tag{2}$$

It is apparent that changes can be made to the droplet discharge amount of the first droplet discharge and the droplet discharge amount of the fifth droplet discharge, and the droplet discharge amount of the second droplet discharge and the droplet discharge amount of the fourth droplet discharge. Assuming that the droplet discharge amount of the fourth droplet discharge is Vd and the droplet discharge amount of the fifth droplet discharge is Ve, the following relationship (3) is satisfied:

$$Ve > Vd > Vc. \tag{3}$$

The total amount of the droplets satisfies the following equation (4):

$$Va + Vb + Vc + Vd + Ve = 10 \text{ pL}. \tag{4}$$

In the equation (4), the size relationship between Va and Ve, and the size relationship between Vb and Vd is not relevant. It should be noted that the relationship may be V=Vb=Vd. That is to say, the droplet discharge amounts may be determined by the percentage based on a prescribed droplet discharge amount.

When the line drawing 142 is formed from 10 droplets shown in FIG. 9B, the relationships of the droplet discharge amount Vf of the first droplet and the tenth droplet, the droplet discharge amount Vg of the second droplet and the ninth droplet, the droplet discharge amount Vh of the third droplet and the eighth droplet, the droplet discharge amount Vi of the fourth droplet and the seventh droplet, and the droplet discharge amount Vj of the fifth droplet and sixth droplet satisfies the following relationship (5), as shown in FIG. 10C:

$$Vf > Vg > Vh > Vi > Vj. \qquad (5)$$

The total amount of the droplets is 2 pL×(number of droplets)=10 pL, and this satisfies the following equation (6):

$$Vf + Vg + Vh + Vi + Vj = 10 \text{ pL}. \qquad (6)$$

It is apparent that changes can be made to the droplet discharge amount of the first droplet discharge and the droplet discharge amount of the tenth droplet discharge, the droplet discharge amount of the second droplet discharge and the droplet discharge amount of the ninth droplet discharge, the droplet discharge amount of the third droplet discharge and the droplet discharge amount of the eighth droplet discharge, and the droplet discharge amount of the fourth droplet discharge and the droplet discharge amount of the seventh droplet discharge, and the droplet discharge amount of the fifth droplet discharge and the droplet discharge amount of the sixth droplet discharge In the present droplet discharge control, when the surface tension with which the two ink droplets in mutual contact pull at each other increases, the percentage by which the droplet discharge amount increases is controlled so as to increase, as shown in FIG. 10D. Shown in the present example is an aspect in which the droplet discharge amount of the ink droplets of the droplet discharge numbers 2 and 4 is greater than the droplet discharge amount of the center area (corresponding to the droplet discharge of the droplet discharge number 3 in FIG. 10D), and the droplet discharge amount of the ink droplets of the droplet discharge numbers 1 and 5 is greater than the droplet discharge numbers 2 and 4. It should be noted that the droplet discharge amounts of the ink droplets of the droplet discharge numbers 2 and 4, and the droplet discharge numbers 1 and 5 may be substantially the same or may be different.

In other words, in the present droplet discharge control, control is carried out so as to increase the percentage by which the droplet discharge amount increases from substantially the center area (vicinity of the center area) toward both ends. Since droplets that gather in the center area increase as the magnitude of the surface tension with which two droplets that are in mutual contact pull on each other increases, the dot diameter of the dots formed after becoming fixed can be reliably made uniform. FIG. 10D shows an aspect in which the droplet discharge amount in substantially the center area is substantially the same without dependence on the surface tension, but the droplet discharge amount in substantially the center area may be varied in accordance with the surface tension.

In lieu of the surface tension between two ink droplets that are in contact with each other, the percentage by which the droplet discharge amount is increased may be varied in accordance with the amount of overlap (contact surface area) between two ink droplets that are in contact with each other. In other words, when the amount of overlap (contact surface area) between two ink droplets that are in contact with each other increases, the surface tension between the ink droplets increases, and the percentage by which the droplet discharge amount is increased is controlled to so as to be greater.

Figure 11A:
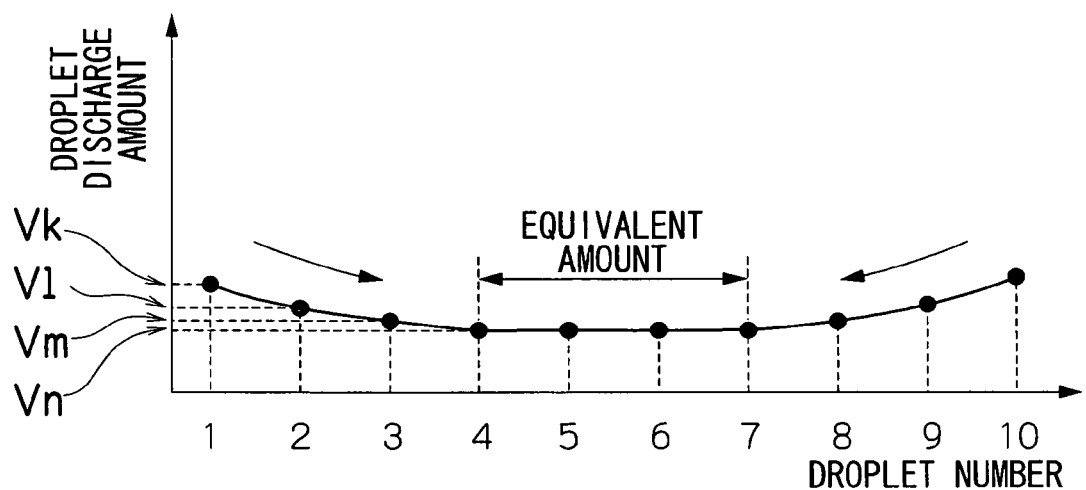
FIGS. 11A and 11B are diagrams describing another aspect of the droplet discharge control shown in FIGS. 10A to 10D.
Figure 11B:
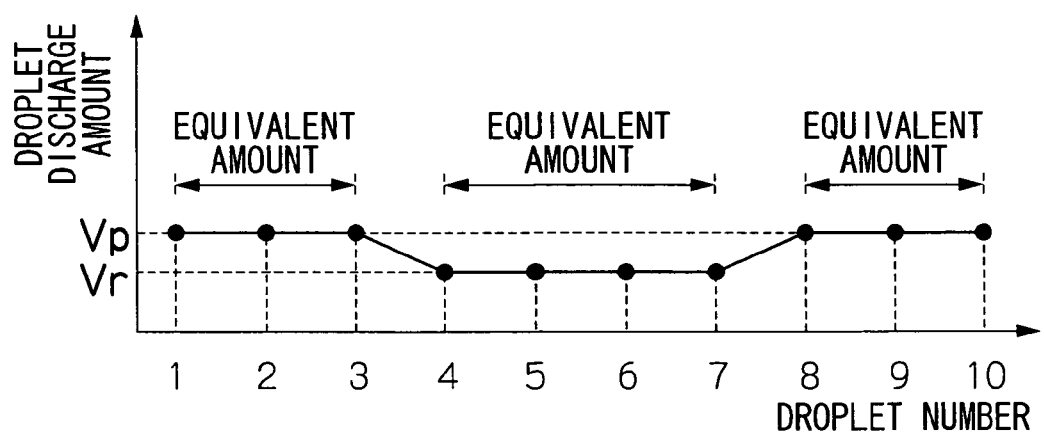
Figure 12A:
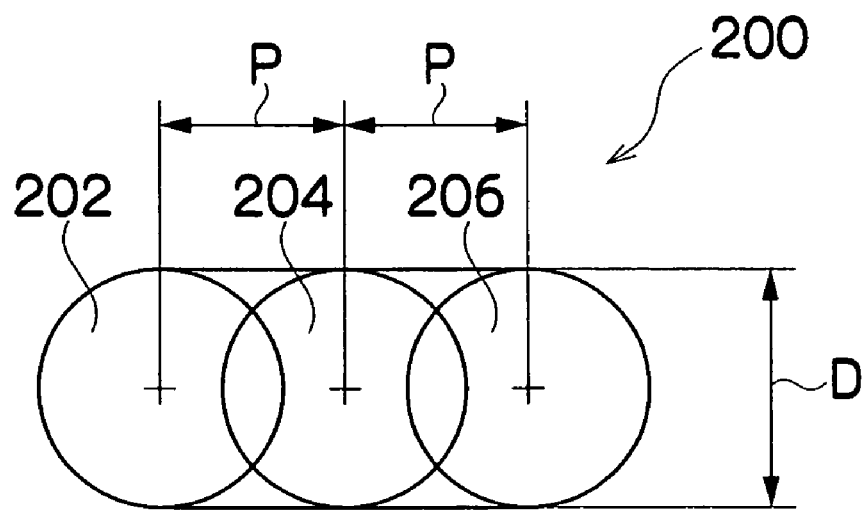
FIGS. 12A and 12B are diagrams describing droplet discharge control of the related art.
Figure 12B:
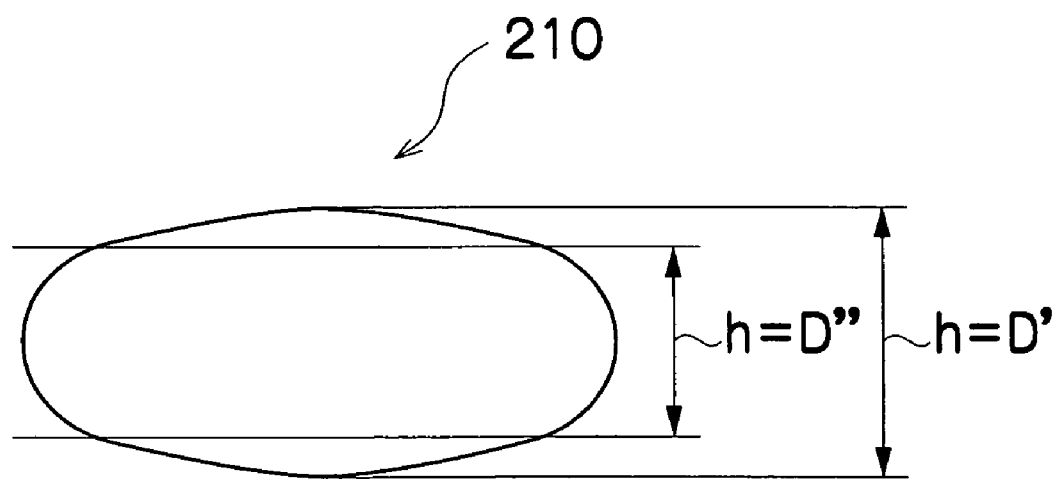
Figure 13A:
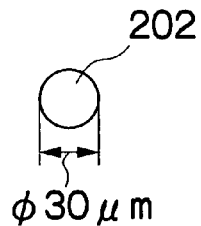
FIGS. 13A to 13D are diagrams showing a line drawing formed with the application of the droplet discharge control shown in FIGS. 12A and 12B.
Figure 13B:
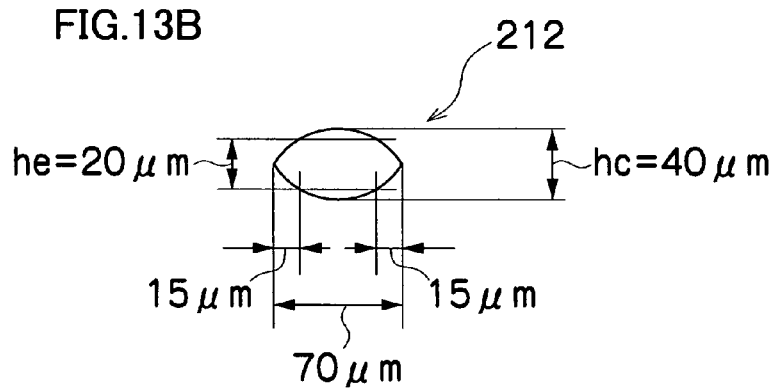
Figure 13C:
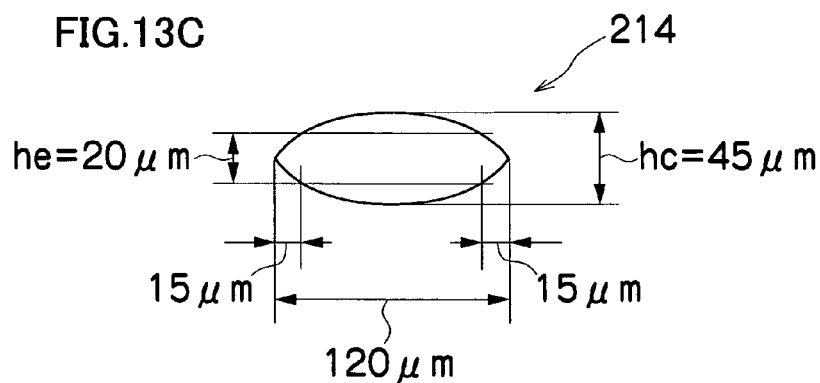
Figure 13D:
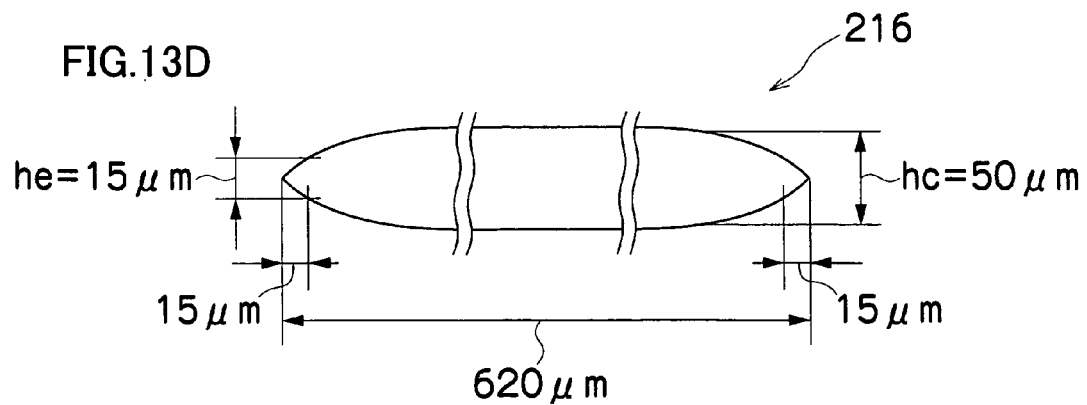
Figure 14A:
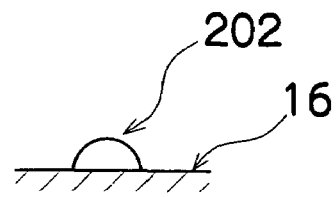
FIGS. 14A to 14D are cross-sectional diagrams showing the three-dimensional shape of the line drawing shown in FIGS. 13A to 13D.
Figure 14B:
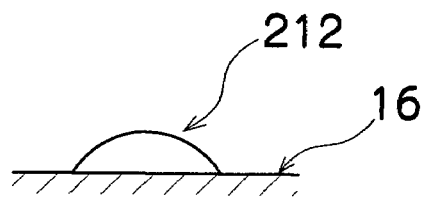
Figure 14C:
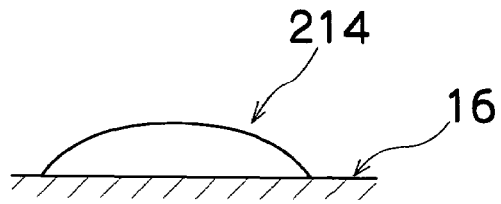
Figure 14D:
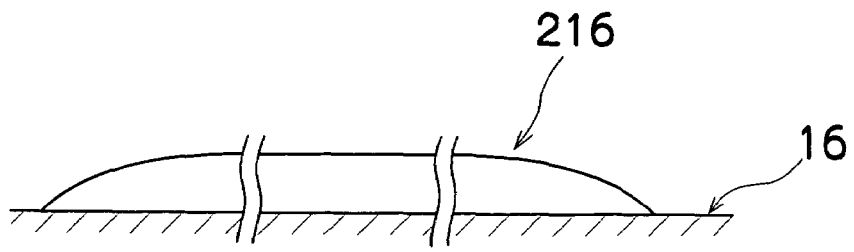

Exemplified in FIGS. 10B to 10D is an aspect in which the droplet discharge amount is continuously varied, but the droplet discharge amount may be changed in a stepwise fashion, as shown in FIGS. 11A and 11B. It should be noted that in FIGS. 10A and 10B the vertical axis represents the droplet discharge amount of the droplet discharges, and the horizontal axis represents the droplet discharge number (droplet discharge point) of the droplet discharges.

In FIG. 10D, the curved line 160 represents a case in which the surface tension (or the amount of overlap) is high, and the curved lines 162 and 164 represent a case in which the surface tension (or the amount of overlap) is low and a case in which the surface tension (or the amount of overlap) is between high and low.

In the aspect shown in FIG. 11A, the droplet discharge amount is continuously reduced from the first droplet discharge to the fourth droplet discharge for Vk to Vn (Vk>Vl>Vm>Vn), the droplet discharge amount Vn is kept without change at the same amount from the fourth droplet discharge to the seventh droplet discharge, and the droplet discharge control is carried out so that the droplet discharge amount is continuously increased from the seventh droplet discharge to the tenth droplet discharge for Vn to Vk.

In other words, the droplet discharge amount may be changed in continuous units of a plurality of droplets, and in the aspect shown in FIGS. 10B and 10C, the droplet discharge amount at both ends corresponding to 30% (corresponding to three droplets if the total number of droplets is 10) of the entire number of droplets may be varied from the amount of liquid in the center portion. Control may also be carried out in which the droplet discharge amount is not changed in at least a portion of the area.

Shown in FIG. 11B is an aspect provided with a plurality of areas in which the droplet discharge amount is not changed. With Vp as the droplet discharge amount from the first droplet discharge to the third droplet discharge and the droplet discharge amount from the eighth droplet discharge to the tenth droplet discharge, and Vr as the droplet discharge amount from the fourth droplet discharge to the seventh droplet discharge (where Vp>Vr), switching is carried out between the droplet discharge amounts at the fourth droplet discharge and the eighth droplet discharge.

In other words, there are at least two types of droplet discharge amounts in the present droplet discharge control, and it is possible to switch between the two types of droplet discharge amounts.

In the substantially simultaneous droplet discharges in the present embodiment, an aspect in which droplets are discharged at very short droplet discharge intervals may also be included.

FIG. 15A to FIG. 17C show droplet discharge examples that are carried out at very short droplet discharge intervals, and these examples are included in the substantially simultaneous droplet discharges of the present embodiment.

Figure 15A:
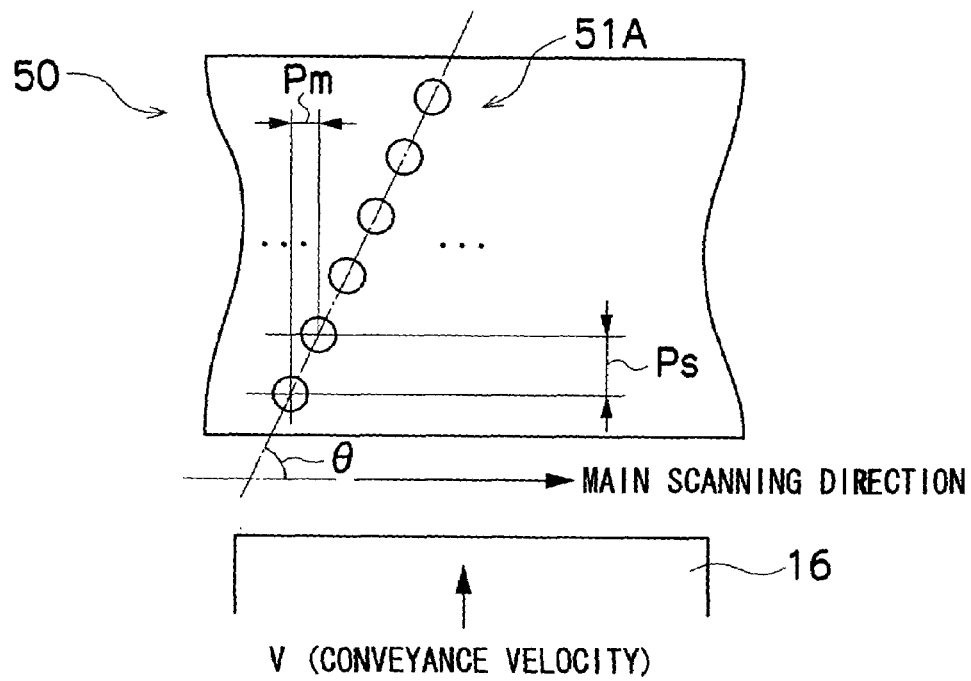
FIGS. 15A and 15B are diagrams describing simultaneous droplet discharge in the sub-scanning direction.
Figure 15B:
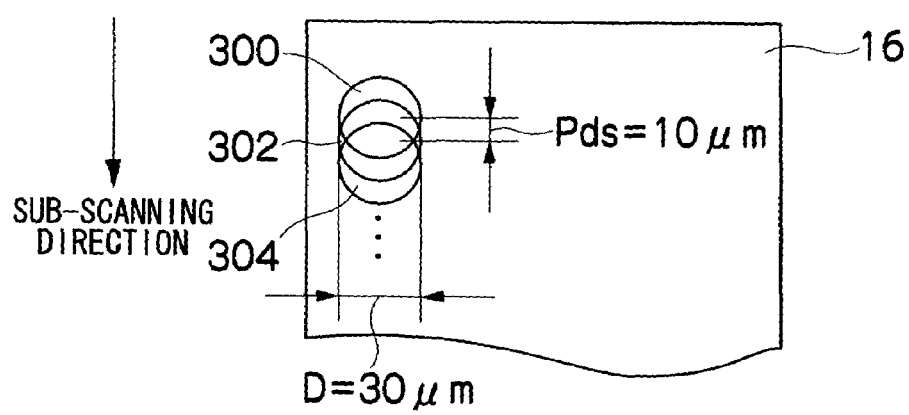

FIG. 15A shows an arbitrary row 51A of nozzles in the print head 50 shown in FIG. 3A and FIG. 5, and FIG. 15B shows a droplet discharge example in which three or more dots 300, 302, 304, and so forth are formed in the sub-scanning direction using the same nozzles with a very short time interval $\Delta t$. The diameter of the dots is assumed to be 30 μm, and the pitch Pds between the dots in the sub-scanning direction 10 μm. (The diameter of an airborne ink droplet that forms a dot with a diameter of 30 μm is substantially 15 μm.)

Six nozzles are aligned in the diagonal direction that forms an angle of θ (where 0°<θ<90°) with the main scanning direction, as shown in FIG. 15A. The pitch between the nozzles of the nozzle row projected so as to align in the main scanning direction is Pm, and the nozzle pitch in the sub-scanning direction is Ps.

Assuming that the time until 1% of the ink of the ink droplet discharged onto the recording paper 16 permeates the recording paper 16 is a very short time interval of $\Delta t$, the condition $\Delta t=0.1$ msec holds true when the permeation time until the discharged ink droplet completely permeates the recording paper 16 is 10 msec.

If the droplet discharge frequency $F(=1/\Delta t)$ is 10 kHz, the conveyance velocity V of the recording paper 16 is $V=Pds\times F=Pds/\Delta t=0.1$ μm/sec.

Figure 16A:
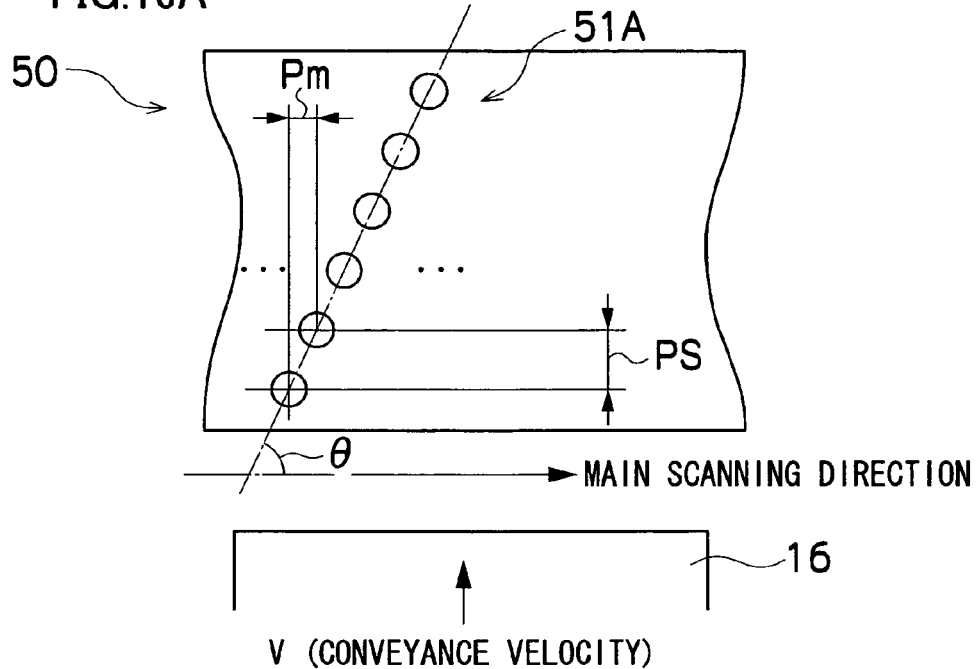
FIGS. 16A to 16C are diagrams describing simultaneous droplet discharge in the main scanning direction.
Figure 16B:
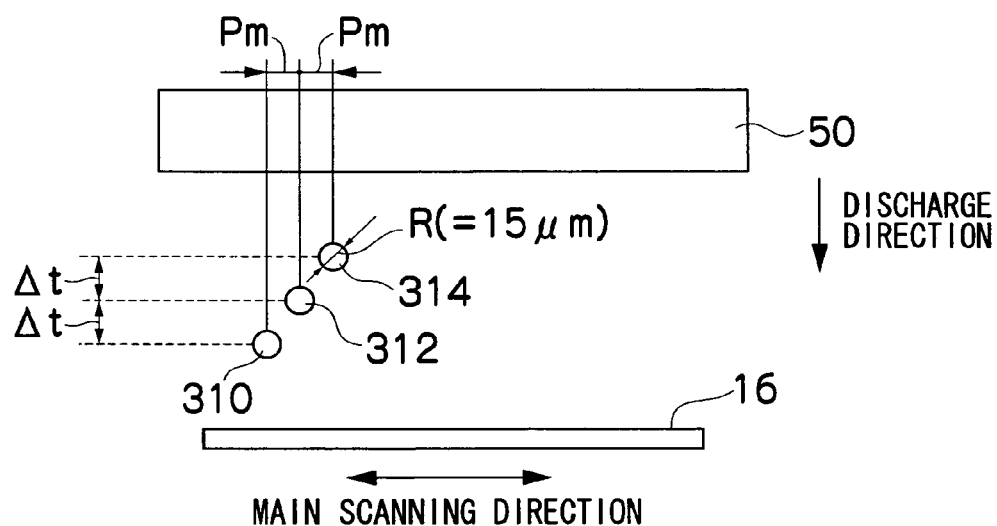
Figure 16C:
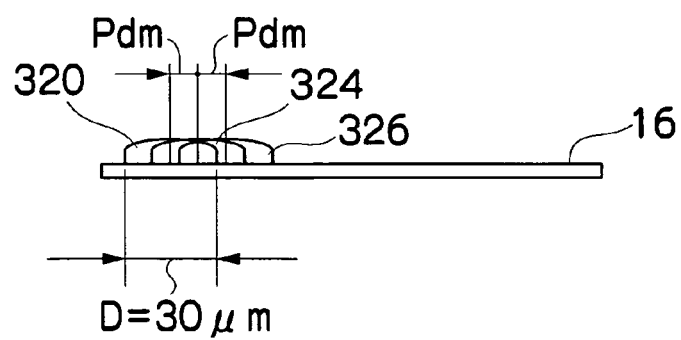

FIGS. 16A to 16C shows the print head 50 having a nozzle row 51A shown in FIG. 15A, and FIG. 16B shows the ink droplets 310, 312, 314, and so forth discharged with a very short time interval $\Delta t$. FIG. 16C shows the dots 320, 322, 324, and so forth formed by the ink droplets 310, 312, 314, and so forth (not shown in FIG. 16C) that have landed on the recording paper 16.

Similar to FIGS. 15A and 15B Pm, it is assumed that the pitch of the projected nozzles in the main scanning direction, Ps is the nozzle pitch in the sub-scanning direction, the diameter of the dots is 30 μm, and the pitch Pdm between the nozzles in the main scanning direction is substantially the same as the pitch Pm between the projected nozzles in the main scanning direction (that is to say, Pdm≅Pm=10 μm). The ink droplet diameter R of the airborne ink droplets 310, 312, 314, and so forth is substantially 15 μm.

When droplets are discharged at a time interval of $\Delta t=0.1$ msec, the conveyance velocity V of the recording paper 16 is $V=\Delta t/Ps$, and when the pitch Ps between the nozzles in the sub-scanning direction is 500 μm, then V=500 μm/0.1 msec=5 m/sec.

It should be noted that the pitch Pdm between the dots in the main scanning direction is substantially the same (that is, Pdm≅Pm) as the pitch Pm between the projected nozzles in the main scanning direction. In common practice, when the required conveyance distance is assumed to be L, then $V=L\Delta t$.

In accordance with the above-described conditions, when the nozzles in the nozzle row 51A are driven in sequence with a time interval of $\Delta t$ while the recording paper 16 is conveyed with the conveyance velocity V=5 m/sec, the ink droplets 310, 312, 314, and so forth are discharged in sequence from the print head 50, and dots are formed in the sequence of dot 320, dot 322, dot 324, and so forth on the recording paper 16.

Figure 17A:
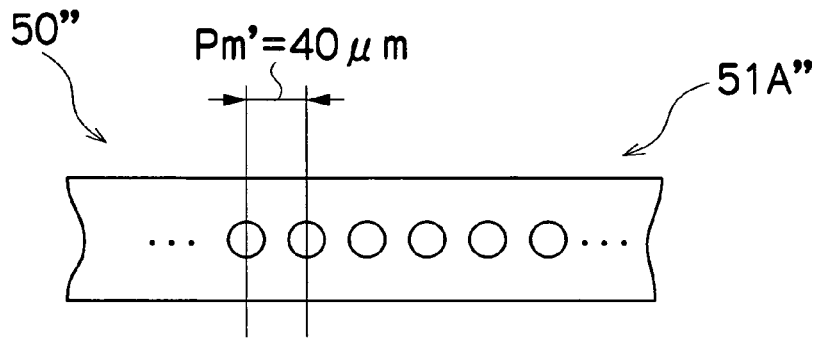
FIGS. 17A to 17C are diagrams describing simultaneous droplet discharge from a print head having a nozzle arrangement that is different from the nozzle arrangement shown in FIGS. 15A and 15B and FIGS. 16A to 16C.
Figure 17B:
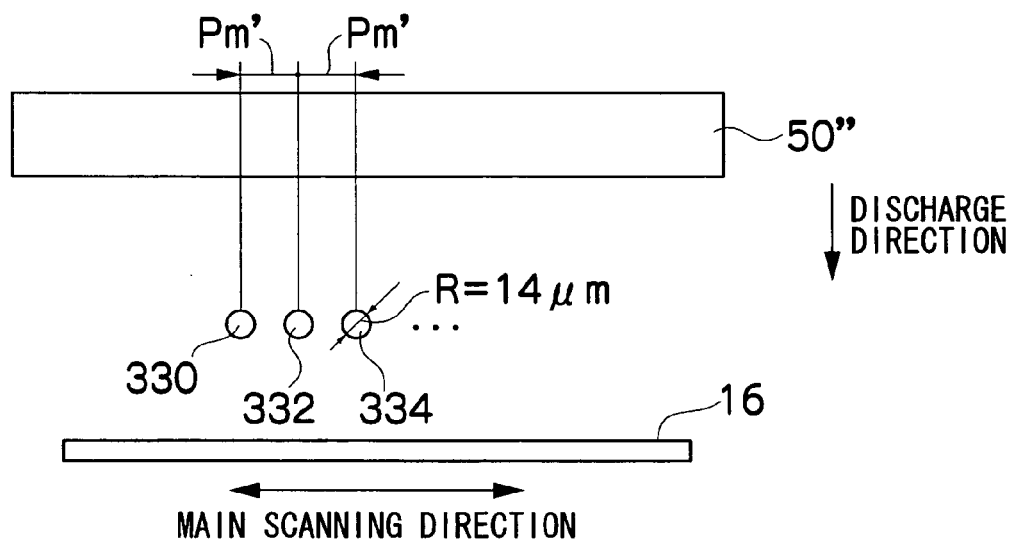
Figure 17C:
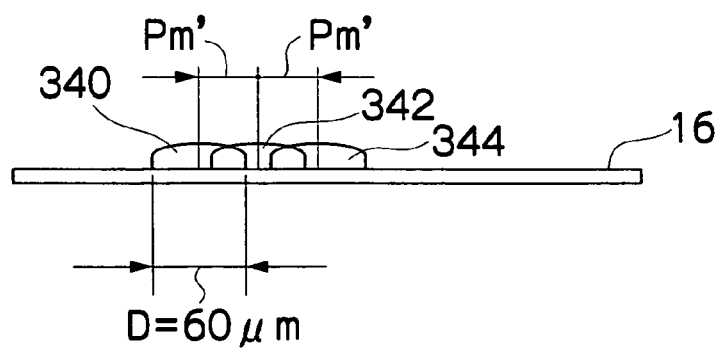

FIG. 17A shows a print head 50" having a single nozzle row 51A" in the main scanning direction, and FIG. 17B shows the ink droplets 330, 332, 334, and so forth simultaneously discharged by the print head 50". FIG. 17C shows the dots 340, 342, 344, and so forth formed in the main scanning direction by the ink droplets 330, 332, 334, and so forth.

The pitch Pm' of the nozzles in the main scanning direction of the print head 50" is 40 μm, as shown in FIG. 17A. In simultaneous droplet discharge in the main scanning direction carried out using the print head 50", the ink droplets can be landed on the recording paper 16 at the same instant without mutual interference (contact, collision, and other forms of interference) between the airborne ink droplets when the airborne droplet diameter R of the discharged ink droplets is less than the pitch Pdm' between the dots (that is, when R<Pdm'), as shown in FIG. 17B.

Assuming that D is the dot diameter, the condition in which the ink droplets discharged to mutually adjacent discharge points interfere with each other (at least a portion overlaps) after the ink droplets land on the recording paper 16 is D>Pdm' (>R), as shown in FIG. 17C.

The pitch Pdm' between the dots in the main scanning direction is substantially the same as the nozzle pitch Pm' in the main scanning direction, and if it is assumed that Pdm'=Pm'=40 μm, the airborne droplet diameter R=14 μm, and the dot diameter D=60 μm, then three or more ink droplets can be landed at the same instant in the main scanning direction using the print head 50" shown in FIG. 17A. It should be noted that the ink droplet amount under the above-described conditions is substantially equal to 14 pL.

In the inkjet recording apparatus configured as described above, when three or more ink droplets are simultaneously discharged on the same line to form a dot row (line drawing having the same line width) comprising dots with the same size on the recording paper 16, the droplet discharge amount is modified so that the amount of ink discharged is sequentially increased from the center area toward both ends, and the line width is therefore made substantially uniform across the entire length of the line drawing even if landing interference cited in the related art occurs. The density of each droplet of a printed image can be made uniform, a fixed shape can be formed, and a more highly detailed printed image can be achieved by varying the droplet amount discharged to the center area and both ends even in the case that the original image has a uniform density.

Also, the droplet discharge amount in the present droplet discharge control can be modified in a continuous fashion or in a stepwise fashion. The present droplet discharge control can have at least two types of droplet discharge amounts.

In the above-described embodiment, an aspect is exemplified in which a substantially linear line drawing 140 or the like is formed in a certain direction (main scanning direction, for example), but the present invention may also be applied when forming a curved line drawing and a line drawing that combines lines and curves.

The formation direction of the line drawing is not limited to the sub-scanning direction, and the formation direction may also be the main scanning direction. The formation direction may be a diagonal direction that has a main scanning direction component and a sub-scanning direction component.

Exemplified in the embodiment described above is a print head used in an inkjet recording apparatus as a droplet discharge head, but the present invention may also be applied to a discharge head used in liquid discharge apparatuses that discharge liquids (water, chemical solutions, resists, treatment fluids) onto substrates such as wafers, glass substrates, substrates made of epoxy or the like, or other discharge media to form images, circuit patterns, machining patterns, and other three-dimensional shapes.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of controlling droplet discharge for a liquid discharge apparatus which discharges droplets from a discharge head onto a discharge receiving medium, the method comprising the steps of:
   discharging at least three droplets substantially simultaneously on a same line so that at least mutually adjacent droplets overlap when landing on the discharge receiving medium;
   controlling the droplet discharge so that a droplet discharge amount sequentially increases in a relative manner from a center area toward both ends of a dot group formed by the at least three droplets; and
   forming the dot group which contains the at least three dots and such that the dot group has substantially a same diameter on an entire length thereof.

2. The method of controlling droplet discharge as defined in claim 1, wherein when at least one parameter selected from a droplet overlap amount on the discharge receiving medium and a surface tension between droplets on the discharge receiving medium increases, the controlling the droplet discharge increases a percentage by which the droplet discharge amount increases in accordance with the at least one parameter.

3. The method of controlling droplet discharge as defined in claim 1, wherein the controlling the droplet discharge further includes
   switching between at least two types of droplet discharge amounts.

4. The method of controlling droplet discharge as defined in claim 1, wherein the controlling the droplet discharge further includes
   making the droplet discharge amount in the center area of the row of dots less than an original droplet discharge amount.

5. The method of controlling droplet discharge as defined in claim 1, wherein the controlling the droplet discharge further includes
   sequentially increasing the droplet discharge amount monotonically from the center area toward both ends of the dot group.

6. The method of controlling droplet discharge as defined in claim 1, wherein the controlling the droplet discharge further includes
   said discharging step discharging at least five droplets, and
   sequentially increasing the droplet discharge amount monotonically from the center area toward both ends of the dot group.

7. The method of controlling droplet discharge as defined in claim 1, the controlling the droplet discharge further includes
   increasing an amount by which the droplet discharge amount increases in accordance with an increase in droplet overlap amount on the discharge receiving medium.

8. The method of controlling droplet discharge as defined in claim 1, the controlling the droplet discharge further includes
   increasing an amount by which the droplet discharge amount increases in accordance with an increase in surface tension between droplets on the discharge receiving medium.

9. The method of controlling droplet discharge as defined in claim 1, the controlling the droplet discharge further includes
   sequentially increases the droplet discharge amount in a stepwise manner, wherein the stepwise increase includes at least one step increase from the center area toward both ends of the dot group.

10. The method of controlling droplet discharge as defined in claim 1, wherein the diameter of the droplet group is substantially same as a diameter of the droplet at the end of the dot group.

11. A liquid discharge apparatus, comprising:
    a discharge head which discharges droplets onto a discharge receiving medium; and
    a control device which, when the discharge head discharges at least three droplets substantially simultaneously on a same line so that at least mutually adjacent droplets overlap when landing on the discharge receiving medium, controls droplet discharge so that a droplet discharge amount sequentially increases in a relative manner from a center area toward both ends of a dot group formed by the at least three droplets, and forms the dot group which contains the at least three dots and such that the dot group has substantially a same diameter on an entire length thereof.

12. The liquid discharge apparatus as defined in claim 11, wherein when at least one parameter selected from a droplet overlap amount on the discharge receiving medium and a surface tension between droplets on the discharge receiving medium increases, the control device increases a percentage by which the droplet discharge amount increases in accordance with the at least one parameter.

13. The liquid discharge apparatus as defined in claim 11, wherein the control device carries out control that switches between at least two types of droplet discharge amounts.

14. The liquid discharge apparatus as defined in claim 11, wherein the control device makes the droplet discharge amount in the center area of the row of dots less than an original droplet discharge amount.

15. The liquid discharge apparatus as defined in claim 11, wherein the control device sequentially increases the droplet discharge amount monotonically from the center area toward both ends of the dot group.

16. The liquid discharge apparatus as defined in claim 11, wherein the discharge head discharges at least five droplets and the control device sequentially increases the droplet discharge amount monotonically from the center area toward both ends of the dot group.

17. The liquid discharge apparatus as defined in claim 11, wherein the control device increases an amount by which the droplet discharge amount increases in accordance with an increase in droplet overlap amount on the discharge receiving medium.

18. The liquid discharge apparatus as defined in claim 11, wherein the control device increases an amount by which the droplet discharge amount increases in accordance with an increase in surface tension between droplets on the discharge receiving medium.

19. The liquid discharge apparatus as defined in claim 11, wherein the control device sequentially increases the droplet discharge amount in a stepwise manner, wherein the stepwise increase includes at least one step increase from the center area toward both ends of the dot group.

20. The liquid discharge apparatus as defined in claim 11, wherein the diameter of the droplet group is substantially same as a diameter of the droplet at the end of the dot group.

21. A method of controlling droplet discharge for a liquid discharge apparatus which discharges droplets from a discharge head onto a discharge receiving medium, the method comprising the steps of:

discharging at least three droplets substantially simultaneously on a same line so that at least mutually adjacent droplets overlap when landing on the discharge receiving medium;

controlling the droplet discharge so that a droplet discharge amount sequentially increases in a relative manner form a center area toward both ends of a dot group formed by the at least three droplets; and forming a line drawing having uniform width by means of the dot group formed by the at least three droplets.

22. A liquid discharge apparatus, comprising:

a discharge head which discharges droplets onto a discharge receiving medium; and a control device which, when the discharge head discharges at least three droplets substantially simultaneously on a same line so that at least mutually adjacent droplets overlap when landing on the discharge receiving medium, controls droplet discharge so that a droplet discharge amount sequentially increases in a relative manner form a center area toward both ends of a dot group formed by the at least three droplets, and forms a line drawing having uniform width by means of the dot group formed by the at least three droplets.

* * * * *